(12) United States Patent
Ito et al.

(10) Patent No.: US 7,562,440 B2
(45) Date of Patent: Jul. 21, 2009

(54) COMPONENT HOLDING TAPE CONNECTING APPARATUS

(75) Inventors: Hitoki Ito, Okazaki (JP); Yukinori Takada, Anjo (JP)

(73) Assignee: Fuji Machine Mfg. Co. Ltd., Chiryu-shi (JP)

( * ) Notice: Subject to any disclaimer, the term of this patent is extended or adjusted under 35 U.S.C. 154(b) by 152 days.

(21) Appl. No.: 10/579,626

(22) PCT Filed: Nov. 15, 2004

(86) PCT No.: PCT/JP2004/016927

§ 371 (c)(1),
(2), (4) Date: Nov. 16, 2006

(87) PCT Pub. No.: WO2005/047153

PCT Pub. Date: May 26, 2005

(65) Prior Publication Data

US 2007/0093117 A1     Apr. 26, 2007

(30) Foreign Application Priority Data

Nov. 17, 2003   (JP) .............................. 2003-387152

(51) Int. Cl.
*B23P 19/00* (2006.01)
(52) U.S. Cl. .............................. 29/739; 29/737; 29/740; 29/741; 226/128
(58) Field of Classification Search .................. 29/729, 29/739, 33 K, 832–834, 447, 564.1–564.2, 29/736, 744; 72/442, 405.2–405.6; 414/411, 414/416, 425; 226/128; 242/558, 566, 564.4
See application file for complete search history.

(56) References Cited

U.S. PATENT DOCUMENTS

| | | | | | |
|---|---|---|---|---|---|
| 1,413,106 | A | * | 4/1922 | Dietze | 140/152 |
| 3,758,355 | A | * | 9/1973 | Witherow | 156/157 |
| 6,073,334 | A | * | 6/2000 | Asai et al. | 29/513 |
| 6,082,603 | A | * | 7/2000 | Takada et al. | 226/157 |
| 6,421,894 | B1 | * | 7/2002 | Tsujimoto et al. | 29/33 K |
| 6,694,606 | B1 | * | 2/2004 | Ohashi et al. | 29/740 |
| 2007/0093117 | A1 | * | 4/2007 | Ito | 439/407 |

FOREIGN PATENT DOCUMENTS

| | | |
|---|---|---|
| JP | A 8-71683 | 3/1996 |
| JP | A 11-40984 | 2/1999 |

* cited by examiner

*Primary Examiner*—Minh Trinh
(74) *Attorney, Agent, or Firm*—Oliff & Berridge, PLC

(57) ABSTRACT

A component-holding-tape connecting apparatus for connecting two component holding tapes through a connecting member, by caulking end portions of the respective two component holding tapes and the connecting member in a caulking position. The apparatus includes: (a) a supplying device supplying the connecting members to the caulking position; (b) a holding device holding, in the caulking position, the end portions of the respective two component holding tapes and the connecting member which is supplied by the supplying device; and (c) a caulking device caulking the end portions of the respective two component holding tapes and the connecting member which are held by the holding device, by causing caulking claws of the connecting member, to pierce through each the end portions of the respective two component holding tapes, and deforming the caulking claws. The supplying device includes a rotary body positioning the connecting members one by one in a predetermined position.

18 Claims, 17 Drawing Sheets

COMPONENT HOLDING TAPE CONNECTING APPARATUS

BACKGROUND

The present invention relates in general to an apparatus for connecting component holding tapes each holding a plurality of electronic circuit components, and more particularly to such an apparatus for connecting the component holding tapes through a metallic connecting member.

There is already known an apparatus for connecting component holding tapes by using a metallic connecting member, for example, as described in Patent Document 1. The metallic connecting member used in the component-holding-tape connecting apparatus described in the Patent Document 1 has a plurality of caulking claws. The component-holding-tape connecting apparatus is equipped with a positioning device for positioning the connecting member and trailing and leading end portions of respective two component holding tapes, and a caulking device for caulking the caulking claws. The trailing and leading end portions are connected to each other, by caulking the caulking claws that are caused to pierce through the trailing and leading end portions while positioning the trailing and leading end portions relative to the connecting member.
Patent Document 1: JP-H11-40984A The present invention was made in view of the background as described above, and has an object to improve a component-holding-tape connecting apparatus for connecting trailing and leading end portions of respective two component holding tapes through a metallic connecting member having a plurality of caulking claws.

SUMMARY

For achieving the object, the essence of the present invention is that, in a component-holding-tape connecting apparatus for connecting trailing and leading end portions of respective two component holding tapes through a metallic connecting member having a plurality of caulking claws, by caulking the trailing and leading end portions of the respective two component holding tapes and the metallic connecting member, with the metallic connecting member being held in close contact with the trailing and leading end portions, and with each of the trailing and leading end portions being pierced by at least one of the plurality of caulking claws of the metallic connecting member, the component-holding-tape connecting apparatus is constructed to include: (a) a supplying device holding a plurality of metallic connecting members each provided by the metallic connecting member, and supplying the plurality of metallic connecting members one by one to a caulking position; (b) a holding device positioning and holding, in the caulking position, the trailing and leading end portions of the respective two component holding tapes and the metallic connecting member that is supplied by the supplying device; and (c) a caulking device causing the at least one of the plurality of caulking claws of the metallic connecting member held by the holding device, to pierce through each of the trailing and leading end portions of the respective two component holding tapes, and caulking the at least one of the plurality of caulking claws of the metallic connecting member.

As a component holding tape, for example, there are a holding tape including a carrier tape and a cover tap and arranged to hold a plurality of electronic circuit components stored in respective component storing recesses which are formed in the carrier tape and which are covered by the cover tape, and also a holding tape arranged to hold a plurality of electronic circuit components having respective leads by holding distal end portions of the leads of the components.

In the component-holding-tape connecting apparatus according to the present invention, trailing and leading end portions of respective two component holding tapes are connected to each other through a single metallic connecting member, by causing caulking claws of the metallic connecting member to pierce through the trailing and leading end portions of the component holding tapes and to be caulked, while holding the metallic connecting member and the trailing and leading end portions positioned in a caulking position. Then, the next metallic connecting member is supplied to the caulking position by a supplying device, before the next connecting operation is initiated. The component-holding-tape connecting apparatus is provided with the plurality of metallic connecting members each of which is positioned in the caulking position by a supplying operation of the supplying device, without requiring an operator to cause the component-holding-tape connecting apparatus to hold the metallic connecting member in each connecting operation. Thus, each connecting operation can be easily and rapidly performed.

Therefore, where an electronic-circuit-component mounting machine is provided with a component supplying apparatus supplying the electronic circuit components through the component holding tape, for example, it is possible to increase efficiency in the mounting operation, owing to reduction in time required for the connecting operation.

Further, the metallic connecting member supplied to the caulking position by the supplying device is positioned together with the trailing and leading end portions of the respective two component holding tapes by a holding device, it is possible to avoid occurrence of connection failure which could be caused if the metallic connecting member were erroneously set in the component-holding-tape connecting apparatus. The connection failure would, for example, suspend the supply of the electronic circuit components, causing the mounting operation to be suspended in the electronic-circuit-component mounting machine and resulting in reduction in the operation efficiency. Such a reduction in the efficiency of the mounting operation can be avoided where the connection of the component holding tapes are reliably performed.

There will be described various modes of the invention deemed to contain claimable features for which protection is sought. It is noted that the invention deemed to contain the claimable feature will be hereinafter referred to as "claimable invention", where appropriate. The claimable invention is interpreted to encompass at least "the present invention" or "the invention of the present application" that is defined in the appended claims, and to encompass also an invention as a subordinate concept of the present invention and an invention as a broader or another concept of the present invention. Each of these modes of the invention is numbered like the appended claims and depends from the other mode or modes, where appropriate, for easier understanding of the claimable invention. It is to be understood that the claimable invention is not limited to the technical features or any combinations thereof which will be described in each of these modes. That is, the scope of the claimable invention should be interpreted in the light of the following descriptions accompanying the various modes and preferred embodiments of the invention. In a limit in accordance with such an interpretation, a mode of the claimable invention can be constituted by not only any one of these modes but also either a mode provided by any one of these modes and additional element or elements incorporated therein and a mode provided by any one of these modes without some of elements recited therein.

(1) A component-holding-tape connecting apparatus for connecting trailing and leading end portions of respective two component holding tapes through a metallic connecting member having a plurality of caulking claws, by caulking the trailing and leading end portions of the respective two component holding tapes and the metallic connecting member, with the metallic connecting member being held in close contact with the trailing and leading end portions, and with each of the trailing and leading end portions being pierced by at least one of the plurality of caulking claws of the metallic connecting member, the component-holding-tape connecting apparatus including:

a supplying device holding a plurality of metallic connecting members each provided by the metallic connecting member, and supplying the plurality of metallic connecting members one by one to a caulking position;

a holding device positioning and holding, in the caulking position, the trailing and leading end portions of the respective two component holding tapes and the metallic connecting member which is supplied by the supplying device; and a caulking device causing the at least one of the plurality of caulking claws of the metallic connecting member held by the holding device, to pierce through each of the trailing and leading end portions of the respective two component holding tapes, and caulking the at least one of the plurality of caulking claws of the metallic connecting member.

(2) The component-holding-tape connecting apparatus according to mode (1), wherein the holding device includes tape positioning protrusions which are fitted into ones of feed holes formed in the two component holding tapes and arranged in a longitudinal direction of each of the component holding tapes, for thereby positioning the trailing and leading end portions, the ones of the feed holes being formed in the trailing and leading end portions.

The tape positioning protrusions are arranged at a spacing pitch which is an integer number of times as large as a spacing pitch of the feed holes. The trailing and leading end portions of the respective two component holding tapes are positioned such that the feed holes formed in the two component holding tapes are continuously arranged at a constant spacing pitch. Thus, the trailing and leading end portions of the two component holding tapes can be easily positioned, by utilizing the feed holes of the component holding tapes.

(3) The component-holding-tape connecting apparatus according to mode (2), wherein the holding device includes tape receiving surfaces which receive the trailing and leading end portions of the respective two component holding tapes, and wherein the tape positioning protrusions are provided to project from the tape receiving surfaces.

The trailing and leading end portions of the component holding tapes are positioned by the tape positioning protrusions while being received on the tape receiving surfaces. Since the component holding tapes are received on the tape receiving surfaces, it is possible to prevent the component holding tapes from hanging down, thereby facilitating operations such as the caulking operation.

(4) The component-holding-tape connecting apparatus according to any of modes (1)-(3), wherein the supplying device includes a rotary body positioning the plurality of metallic connecting members one by one in a predetermined position, by being rotated about a rotary axis thereof by a predetermined angle.

Where the metallic connecting members are supplied by the rotary body, a space required for the supply of the connecting members can be made smaller than where the connecting members are supplied by a linear movement of a linearly moving device. Thus, the component-holding-tape connecting apparatus can be simply constructed, irrespective of whether the above-described "predetermined position" is the above-described caulking position or different from the caulking position.

(5) The component-holding-tape connecting apparatus according to mode (4), wherein the caulking device is operated by operation of an operating lever, the component-holding-tape connecting apparatus including a motion converting device converting a pivot motion of the operating lever into a rotary motion of the rotary body.

In the component-holding-tape connecting apparatus of the present mode, the caulking of the caulking claws by the caulking device and the supply of the connecting member are made together with each other. That is, the next metallic connecting member is automatically supplied to the predetermined position, when the caulking claws are caulked. Thus, it is possible to obtain the component-holding-tape connecting apparatus in which the connecting operation is further easily performed.

(6) The component-holding-tape connecting apparatus according to mode (4) or (5), wherein the rotary body has a plurality of metallic-connecting-member holding portions in an outer circumferential surface thereof, and holds the connecting members in the respective metallic-connecting-member holding portions.

(7) The component-holding-tape connecting apparatus according to mode (6), wherein the connecting member has an elongated shape, and wherein each of the connecting-member holding portions holds the connecting member such that a longitudinal direction of the connecting member corresponds to a circumferential direction of the rotary body.

In the component-holding-tape connecting apparatus of the present mode, for example, the rotary body does not have to be made large in a direction parallel to its rotary axis, and can be arranged to stably hold the connecting members without each metallic connecting member being overhung from the rotary body.

(8) The component-holding-tape connecting apparatus according to mode (6) or (7), wherein each of the metallic-connecting-member holding portions has a connecting-member receiving surface which receives the metallic connecting member and a connecting-member positioning protrusion which is provided to project from the connecting-member receiving surface and which is fitted in a positioning hole formed in the metallic connecting member.

Where the feed holes are provided in the component holding tapes, the connecting-member positioning protrusion is fitted into also a corresponding one of the feed holes, for thereby positioning the trailing and leading end portions of the respective two component holding tapes. Since the two component holding tape are connected with the feed and positioning holes being aligned with each other, the feed of the tapes is not impeded by the connecting member which does not close the feed holes.

(9) The component-holding-tape connecting apparatus according to any of modes (6)-(8), including a rotary-body holding portion rotatably and detachably holding the rotary body.

In the component-holding-tape connecting apparatus of the present mode, for example, the apparatus can be easily replenished with the connecting members by replacement of the rotary body.

(10) The component-holding-tape connecting apparatus according to mode (9), wherein each of at least one of the rotary body and the rotary-body holding portion has a magnet, and wherein the rotary body is attracted by the rotary-body holding portion owing to a magnetic force of the magnet, so as to be held by the rotary-body holding portion.

Where one of the rotary body and the rotary-body holding portion has the magnet, the other of the rotary body and the rotary-body holding portion is made of a ferromagnetic material.

The utilization of the magnet facilitates the rotary body to be attached and removed to and from the rotary-body holding portion. For example, the replenishment of the apparatus with the connecting members can be easily made by replacement of the rotary body.

(11) The component-holding-tape connecting apparatus according to mode (10), wherein the rotary body and the rotary-body holding portion both have magnets each provided by the magnet, and wherein the magnets provided in one of the rotary body and the rotary-body holding portion are disposed to be spaced apart from each other by an angular pitch equal to an angle of one rotational motion of the rotary body, for thereby positioning the rotary body in an angular position in which each of the magnets provided in the one of the rotary body and the rotary-body holding portion is just opposed to the magnet provided in the other of the rotary body and the rotary-body holding portion.

At least one of the magnets is provided by a plurality of magnet members, so that the rotary body can be positioned in any one of a plurality of angular positions. An amount of attraction generated by the magnetic force differs depending upon whether the one and the other of the magnets are just opposed to each other or not, so that the rotary body can be position in each of the angular positions whose angular pitch corresponds to one rotational motion of the rotary body. That is, where the two magnets are just opposed to each other, the amount of attraction is maximized whereby the rotary body is made difficult to be rotated relative to the rotary-body holding portion, so that the rotary body can be positioned in each one of the angular positions. The other of the magnets may be provided by either a plurality of magnet members or a single magnet member. Where each of the rotary body and the rotary-body holding portion is provided with the plurality of magnet members, the amount of attraction by which the rotary body and the rotary-body holding portion are attracted to each other can be mad large in each position in which a plurality of pairs of magnets are just opposed to each other.

At least one of the magnets may be provided by a plurality of magnet members which are arranged over an entire circumference whose center corresponds to the rotary axis of the rotary body, while a positioning device may be provided to position the rotary body in a plurality of angular positions each of which causes a corresponding one of the plurality of metallic connecting members to be positioned in the caulking position. In this arrangement, the other of the magnets may be provided by either a plurality of magnet members or a single magnet member.

(12) The component-holding-tape connecting apparatus according to mode (4) or (5), wherein the plurality of metallic connecting members are equally spaced apart from each other and are held by a holding member which has an elongated shape and which has engaged portions equally spaced apart from each other in a longitudinal direction of the holding member, and wherein the rotary body has, in an outer circumferential surface, engaging portions which are equi-angularly spaced apart from each other and which are to be held in engagement with the respective engaged portions.

The arrangement of the plurality of metallic connecting members held by the holding member eliminates necessity of handling the connecting members individually of each other, thereby making it possible to easily and rapidly supply the connecting members, particularly, where each connecting member is small in size. Further, this arrangement facilitates storage and stock management of the connecting members and makes it possible to prevent missing of the connecting members in the connecting operation.

The engaged portions of the holding member are sequentially brought into engagement with the respective engaging portions of the rotary body, as consequence of rotation of the rotary body, so that the plurality of connecting members are positioned one by one in the predetermined position.

(13) The component-holding-tape connecting apparatus according to mode (12), wherein the holding member is formed integrally with the metallic connecting members to which the holding member is partially connected, through an operation in which a metal strip is punched.

The holding member holding the plurality of connecting members can be easily obtained.

(14) The component-holding-tape connecting apparatus according to mode (13), wherein the engaging portions are feed protrusions which are to be held in engagement with the respective engaged portions in the form of feed holes which are formed in the metal strip and are arranged at a constant spacing interval in a longitudinal direction of the metal strip.

(15) The component-holding-tape connecting apparatus according to mode (13) or (14), including a cutting-off device cutting each of the metallic connecting members off from the holding member while the each of the metallic connecting members is being positioned in the predetermined position.

Each of the connecting members held by the holding member is cut off from the holding member by the cutting-off device, so as to be used for connecting the component holding tapes.

(16) The component-holding-tape connecting apparatus according to mode (15), including a moving device holding the metallic connecting member cut off by the cutting-off device and moving the metallic connecting member to the caulking position, the moving device cooperating with the rotary body to constitute the supplying device.

(17) The component-holding-tape connecting apparatus according to mode (16), wherein the moving device includes a second rotary body which is other than the rotary body as a first rotary body, and wherein the second rotary body has a plurality of metallic-connecting-member holding portions, and is rotatable about a second rotary axis thereof which is other than the rotary axis as a first rotary axis.

The second rotary body holds the connecting members in the respective metallic-connecting-member holding portions, and is rotated to move each of the connecting members to the caulking position. The movement of each connecting member to the caulking position can be made within a small space.

(18) The component-holding-tape connecting apparatus according to mode (17), wherein the plurality of metallic-connecting-member holding portions have respective magnets, and hold the metallic connecting members which are attracted owing to a magnetic force of each of the magnets.

The connecting-member holding portions can easily and reliably hold the respective metallic connecting members.

(19) The component-holding-tape connecting apparatus according to mode (17) or (18), wherein the cutting-off device has cutting blades each of which is provided in a corresponding one of the plurality of metallic-connecting-member holding portions.

Each of the connecting-member holding portions comes to hold the connecting member by cutting the connecting member off from the holding member. After the connecting member has been cut off from the holding member, it is not necessary to carry out an operation to cause the connecting-member holding portion to hold the connecting member, so that the connecting member can be easily and reliably held by the connecting-member holding portion Further, the connecting-member holding portion constitutes a part of the cutting-off device, thereby making it possible to simplify the construction of the component-holding-tape connecting apparatus.

(20) The component-holding-tape connecting apparatus according to any of modes (17)-(19), wherein each of the plurality of metallic-connecting-member holding portions constitutes a caulking tool for caulking the at least one of the plurality of caulking claws.

The connecting-member holding portion constitutes a part of the caulking device, thereby making it possible to simplify the construction of the component-holding-tape connecting apparatus.

(21) The component-holding-tape connecting apparatus according to any of modes (17)-(20), wherein the caulking device is operated by operation of an operating lever, the component-holding-tape connecting apparatus including a second motion converting device converting a pivot motion of the operating lever into a rotary motion of the second rotary body.

The second rotary body is rotated together with the operation of the caulking device that is based on the operation of the operating lever, whereby the connecting member can be automatically positioned in the caulking position. This arrangement enables the connecting member to be rapidly and easily positioned, without requiring an operator to rotate the second rotary body so as to position the connecting member (that has been cut off from the holding member) in the caulking position.

(22) The component-holding-tape connecting apparatus according to any of modes (12)-(21), including a first guide portion that is to guide a portion of the holding member from which the plurality of metallic connecting members are not yet separated, toward the rotary body.

The holding member holding the plurality of metallic connecting members has an elongated shape. Where the elongated-shaped holding member is guided by the guide portion, for example, the holding member can be reliably guided toward the rotary body without interfering with the operation to attach the trailing and leading end portions of the respective two component holding tapes to the component-holding-tape connecting apparatus and the operation to caulk the connecting member.

(23) The component-holding-tape connecting apparatus according to mode (22), wherein the caulking device is operated by operation of an operating lever, and wherein the first guide portion constitutes a second operating lever which cooperates with the operating lever as a first operating lever to operate the caulking device.

It is possible to simply construct the component-holding-tape connecting apparatus in which the holding member from which the connecting members are not yet separated is guided.

(24) The component-holding-tape connecting apparatus according to any of modes (12)-(23), including a second guide portion that is to guide a portion of the holding member from which the plurality of metallic connecting members have been separated, from a vicinity of the rotary body toward a position distant from the rotary body.

Where the portion of the holding member from which the connecting members have been separated is guided by the guide portion, for example, it is possible to avoid the holding member from interfering with the operation to attach the trailing and leading end portions of the respective two component holding tapes to the component-holding-tape connecting apparatus and the operation to caulk the connecting member.

(25) The component-holding-tape connecting apparatus according to mode (24), wherein the caulking device is operated by operation of an operating lever, and wherein the second guide portion constitutes a second operating lever which cooperates with the operating lever as a first operating lever to operate the caulking device.

It is possible to simply construct the component-holding-tape connecting apparatus in which the holding member from which the connecting members have been separated is guided.

The component-holding-tape connecting apparatus of the present mode may include the first guide portion that is to guide the portion of the holding member from which the plurality of metallic connecting members are not yet separated, toward the rotary body, such that the first guide portion as well as the second guide portion constitutes the second operating lever. In this case, the first and second guide portions both constitute the second operating lever, and the holding member is guided either before and after the connecting members are separated from the holding member. Thus, the component-holding-tape connecting apparatus that is easy to handle can be made compact.

(26) A strip body providing a plurality of metallic connecting members which are equally spaced apart from each other and which are held by a holding member having an elongated shape, each of the connecting members having a main body portion and a plurality of caulking claws provided to project from the main body portion, each of the connecting members serving to connect trailing and leading end portions of respective two component holding tapes therethrough, with the each of the metallic connecting members being held in close contact with the trailing and leading end portions, and with at least one of the plurality of caulking claws being caused to pierce through each of the trailing and leading end portions and to be caulked.

(27) The strip body according to mode (26), wherein the holding member has a plurality of engaging portions formed therein and arranged at a constant spacing interval in a longitudinal direction thereof, such that a feed protrusion of a feed member is to be held in engagement with each of the engaging portions.

DETAILED DESCRIPTION OF THE EMBODIMENTS

There will be described some embodiments of the claimable invention in detail with reference to the drawings.

Figure 1:
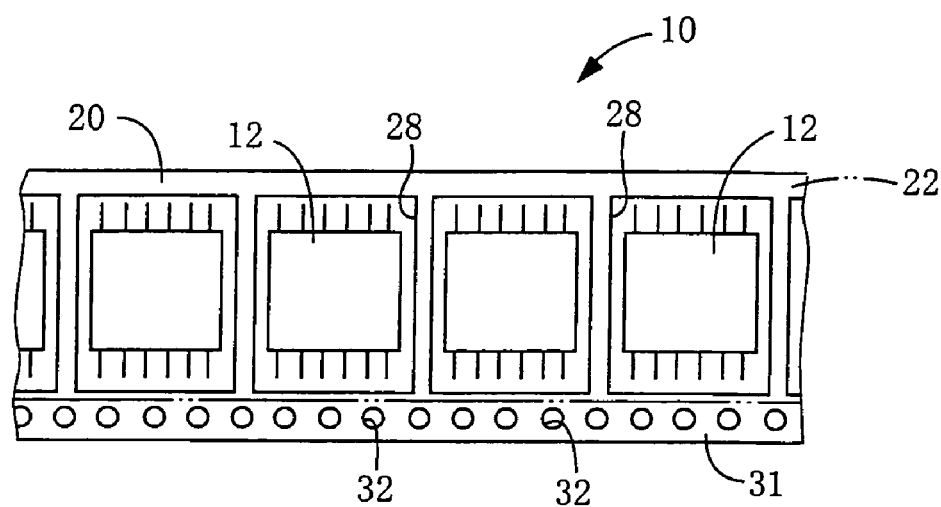
[FIG. 1] A plan view showing a part of a component holding tape that is to be connected to another tape by a component-holding-tape connecting apparatus as an embodiment of the claimable invention.
Figure 2:
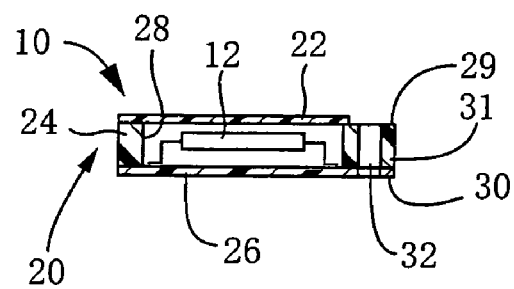
[FIG. 2] A side cross sectional view showing the component holding tape.
Figure 3:
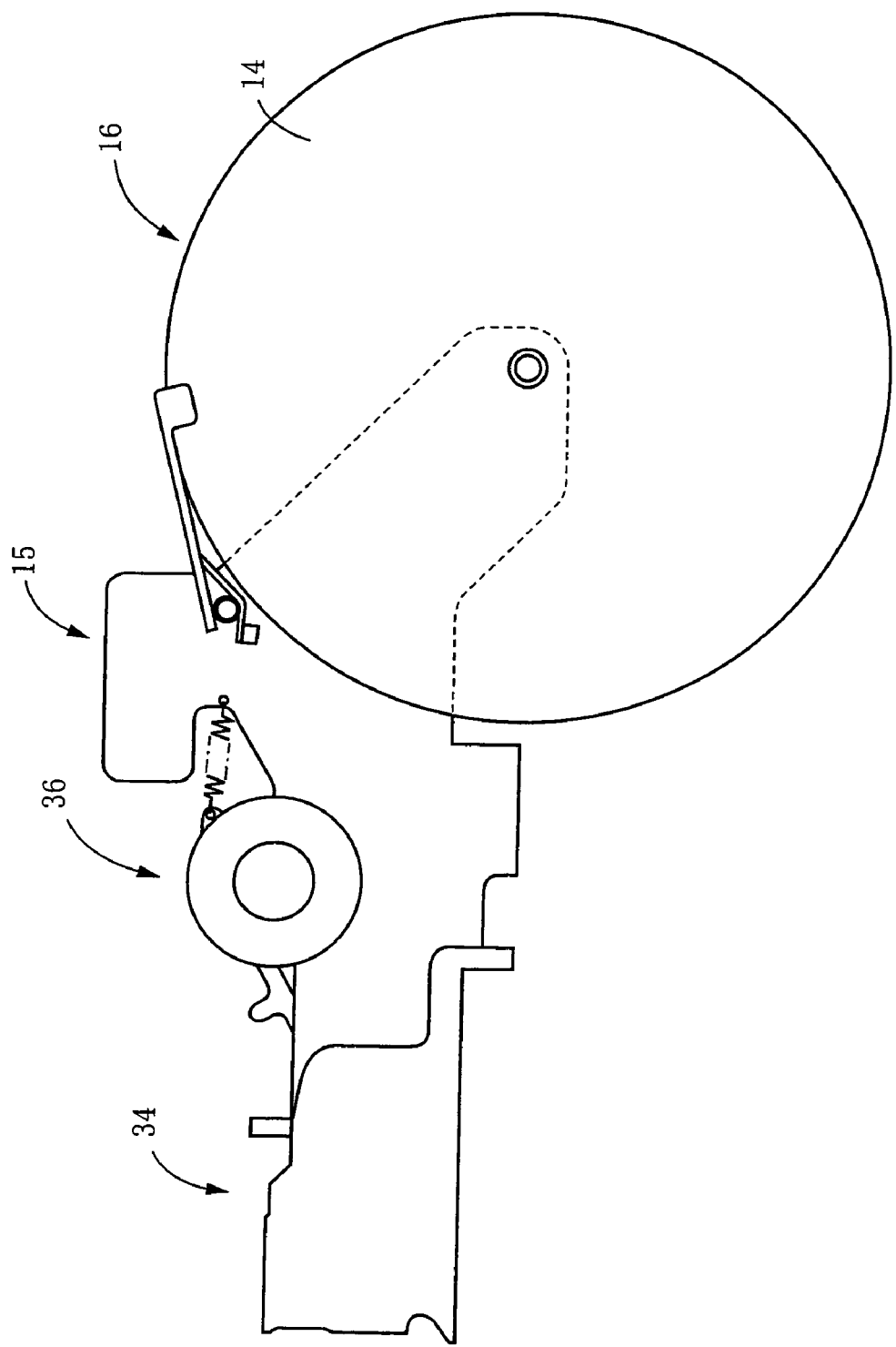
[FIG. 3] A front view showing a tape feeder for supplying electronic circuit components through the component holding tape.

In FIGS. 1 and 2, reference numeral 10 denotes a component holding tape holding electronic circuit components 12 (hereinafter simply referred to as "components 12"). The component holding tape 10 is stored in a tape storing device 16 of a tape feeder 15 as a kind of component supplying feeder as a component supplier, while being wound around a tape reel 14, as schematically shown in FIG. 3. In the component holding tape 10, the components 12 are taped by a carrier tape 20 and a cover tape 22. Each of the components 12 is to be mounted on a circuit board such as a printed-wiring board, so as to constitute an electronic circuit. In the present embodiment, the carrier tape 20 is constructed, as shown in FIG. 2, such that a bottom tape 26 is adhered to a bottom surface of a main body tape 24 that is made of a thick paper sheet, and such that component storing recesses 28 as component storing portions are formed in a widthwise central portion of the carrier tape 20 and are arranged at a constant spacing interval. In each of the component storing recesses 28, there is stored a corresponding one of the components 12. The cover tape 22 is adhered to a top surface 29 of the carrier tape 20, so as to cover an upper opening of each of the component storing recesses 28. Feed holes 32 are arranged along an end portion 31 of the carrier tape 20 that is elongated in parallel to a longitudinal direction of the carrier tape 20, and are formed through the carrier tape 20. The feed holes 32, each extending from the top surface 20 up to a bottom surface 30 of the carrier tape 20, are arranged in a row at a constant spacing pitch. The cover tape 22 is arranged to cover an entirety of the carrier tape 20 except a portion of the carrier tape 20 in which the feed holes 32 are provided.

Figure 10:
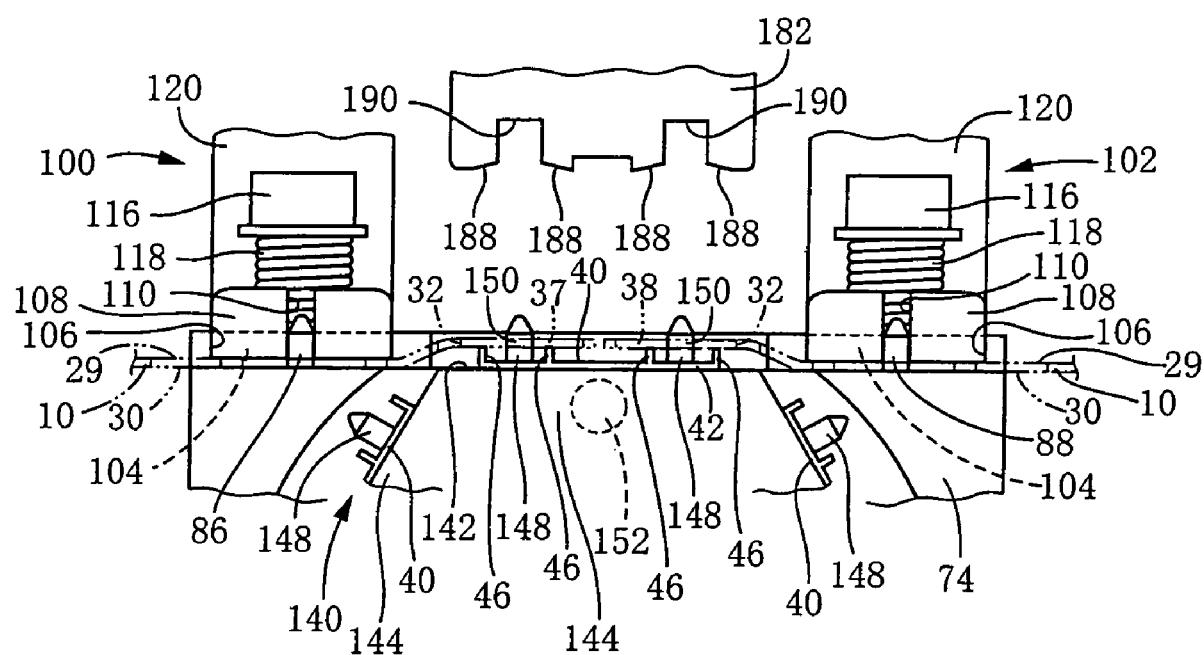
[FIG. 10] A side view showing a state in which the single metallic connecting member and the trailing and leading end portions of the respective two component holding tapes are positioned and held in the caulking position in the component-holding-tape connecting apparatus.

In the tape feeder 15, the component holding tape 10 is intermittently fed in its longitudinal direction as a tape feed direction by a tape feeding device 34, such that the component holding tape 10 is fed by a contact distance in each of successive feed motions, and the cover tape 22 is peeled by a cover tape peeling device 36. A leading one of the components 12 stored in the component storing recesses 28 from which the cover tape 22 has been peeled, is fed to a component pick-up position in which the leading component 12 is to be picked up by a vacuum-suction nozzle of a suction head. When the component holding tape 10 wound on the reel 14 has been almost exhausted of the components 12 as a result of successive supply of the components 12, another component holding tape 10 is supplied by an operator. In this instance, the reel 14 storing the almost exhausted component holding tape 10 as a preceding component holding tape is removed, and then a next reel 14 supplying a next component holding tape 10 is set. Further, as shown in FIG. 10, a trailing end portion 37 of the preceding component holding tape 10 assigned to actually supply the components 12 is connected to a leading end 38 of the next component holding tape 10 assigned to next supply the components 12, through a metallic connecting member (splicing fitting) 40.

Figure 4:
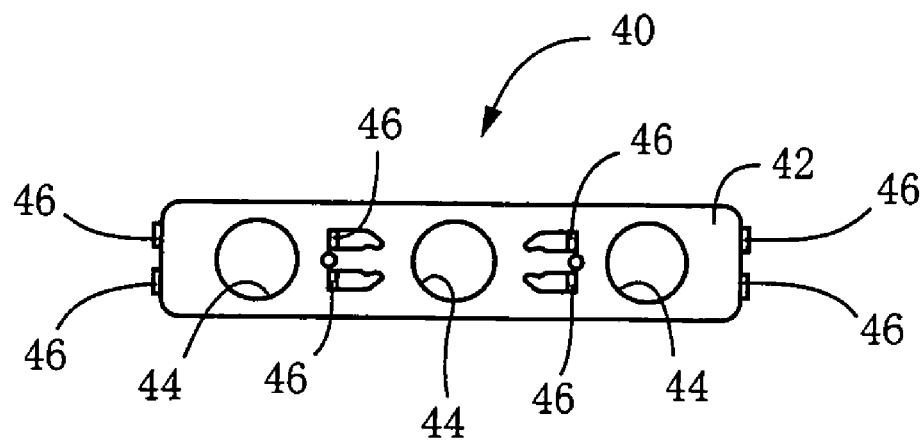
[FIG. 4] A plan view showing a metallic connecting member for connecting a trailing end portion and a leading end portion of respective two component holding tapes.
Figure 5:
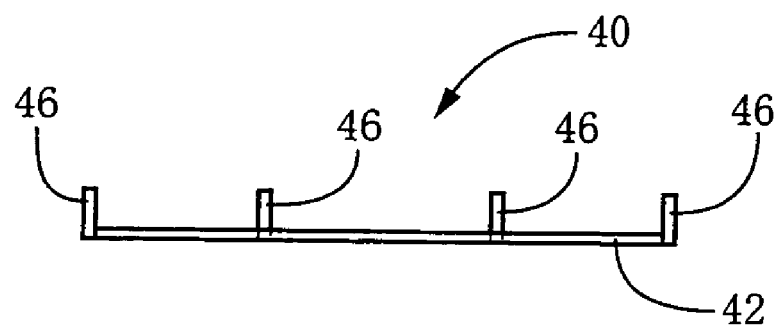
[FIG. 5] A side view showing the metallic connecting member.

Since the metallic connecting member 40 is constructed as a metallic connecting member disclosed in JP-A-H11-40984 in the present embodiment, it will be briefly described. In the present embodiment, the connecting member 40 is made of a ferromagnetic material such as steel. As shown in FIGS. 4 and 5, the connecting member 40 has a main body portion 42 provided by a rectangular plate having an elongated shape, a plurality of positioning holes 44 (thee positioning holes in the present embodiment) formed in the main body portion 42 and arranged at the same pitch as the feed holes 32 of the component holding tape 10, and a plurality of caulking staples or claws 46 (eight claws in the present embodiment) perpendicularly projecting from the main body portion 42. The main body portion 42 has such a width that enables the carrier tapes 20 to be connected through the connecting member 40 at respective portions which have the feed holes 32 formed therein and which are not covered by the respective cover tapes 22. Each of the caulking claws 46 has a height larger than a thickness of the carrier tape 20. The eight caulking claws 46 constitutes four pairs of caulking claws 46, and each of the four pairs consists of two caulking claws 46. The four pairs of caulking claws 46 are respectively provided in longitudinally opposite ends of the main body portion 42 and portions of the main body portion 42 that are located between the three positioning holes 44.

There will be described a component-holding-tape connecting apparatus 60 for connecting the trailing and leading end portions 37, 38 of the respective component holding tapes 10 through the connecting member 40. The connecting member 40 is to connect the carrier tapes 20 of the respective two component holding tapes 10. In the present embodiment, the component-holding-tape connecting apparatus 60 is a carrier-tape connecting tape.

Figure 6:
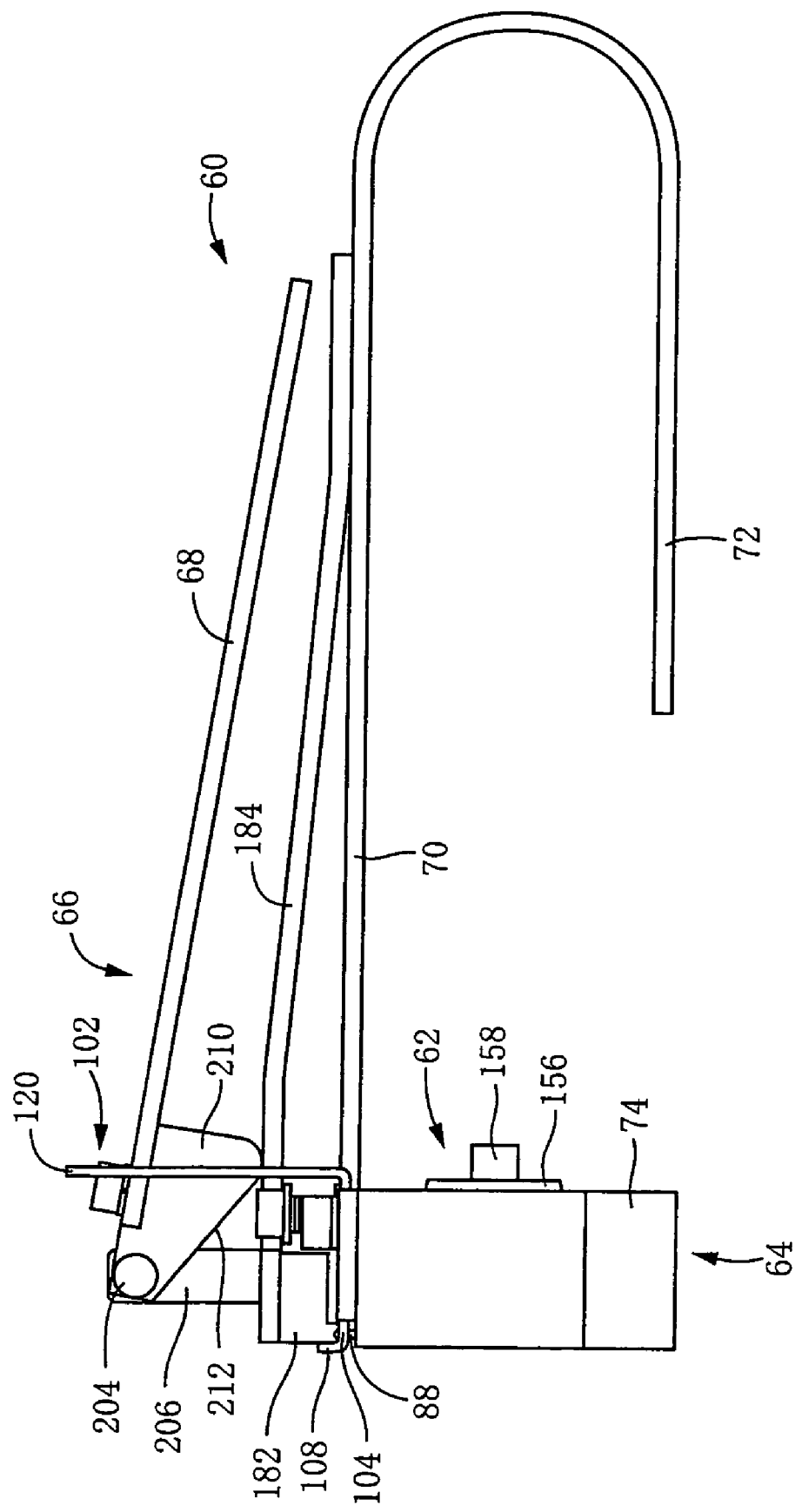
[FIG. 6] A front view showing the component-holding-tape connecting apparatus.
Figure 9:
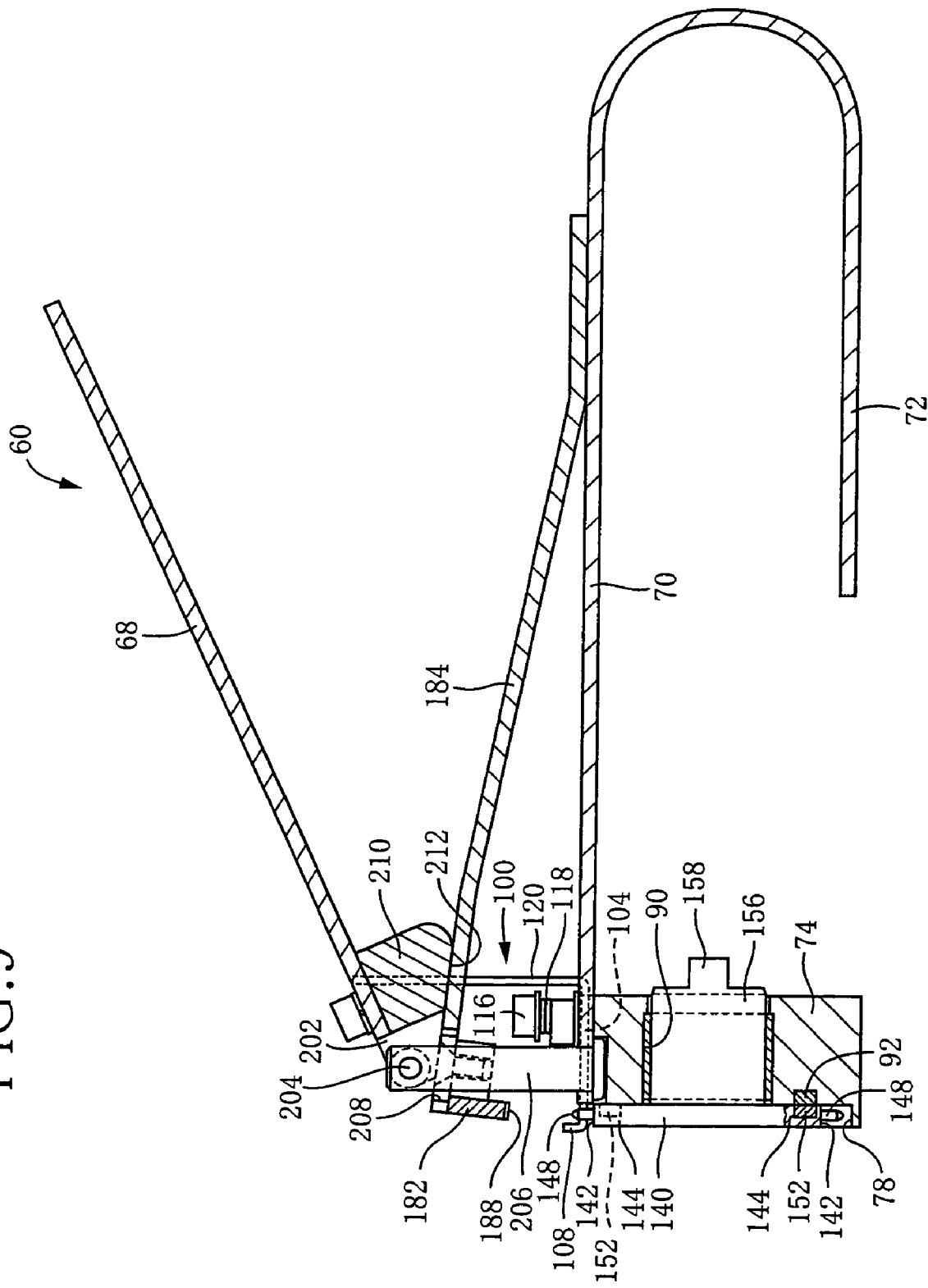
[FIG. 9] A front cross sectional view showing the component-holding-tape connecting apparatus.

The component-holding-tape connecting apparatus 60 includes a supplying device 62, a holding device 64 and a caulking device 66, as shown in FIGS. 6 and 9.

In the present embodiment, the caulking device 66 includes operating members in the form of a first operating lever 68 and a second operating lever 70. The second operating lever 70 is provided by an elongated-shaped plate member, and has a handle 72 in its longitudinal end portion in the present embodiment. The handle 72 is provided by the longitudinal end portion of the second operating lever 70 that is bent to have a U shape so as to provide a spacing gap for receiving therein a hand of the operator. In the other longitudinal end portion of the second operating lever 70, there is detachably fixed a holding body 74 through suitable fixing means such bolts.

Figure 7:
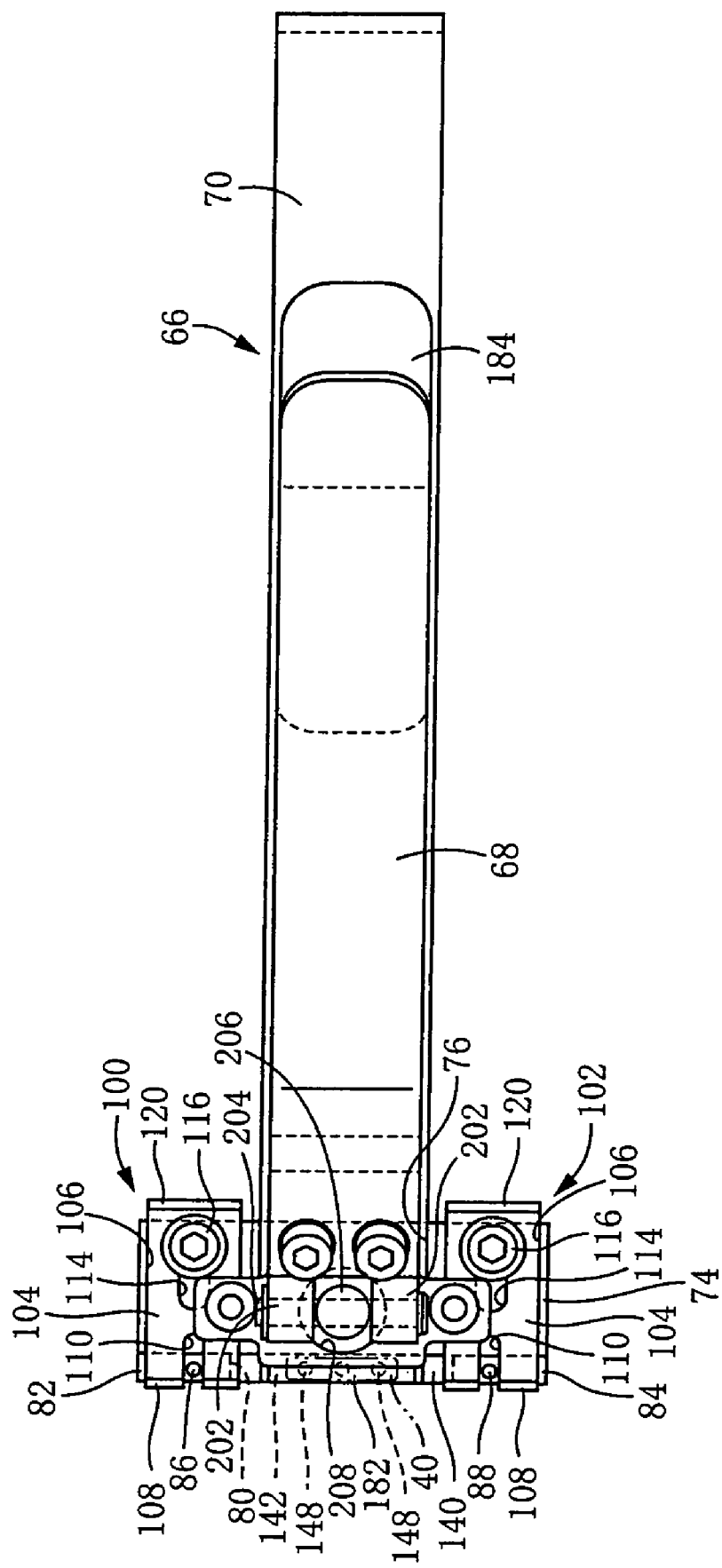
[FIG. 7] A plan view showing the component-holding-tape connecting apparatus.
Figure 8:
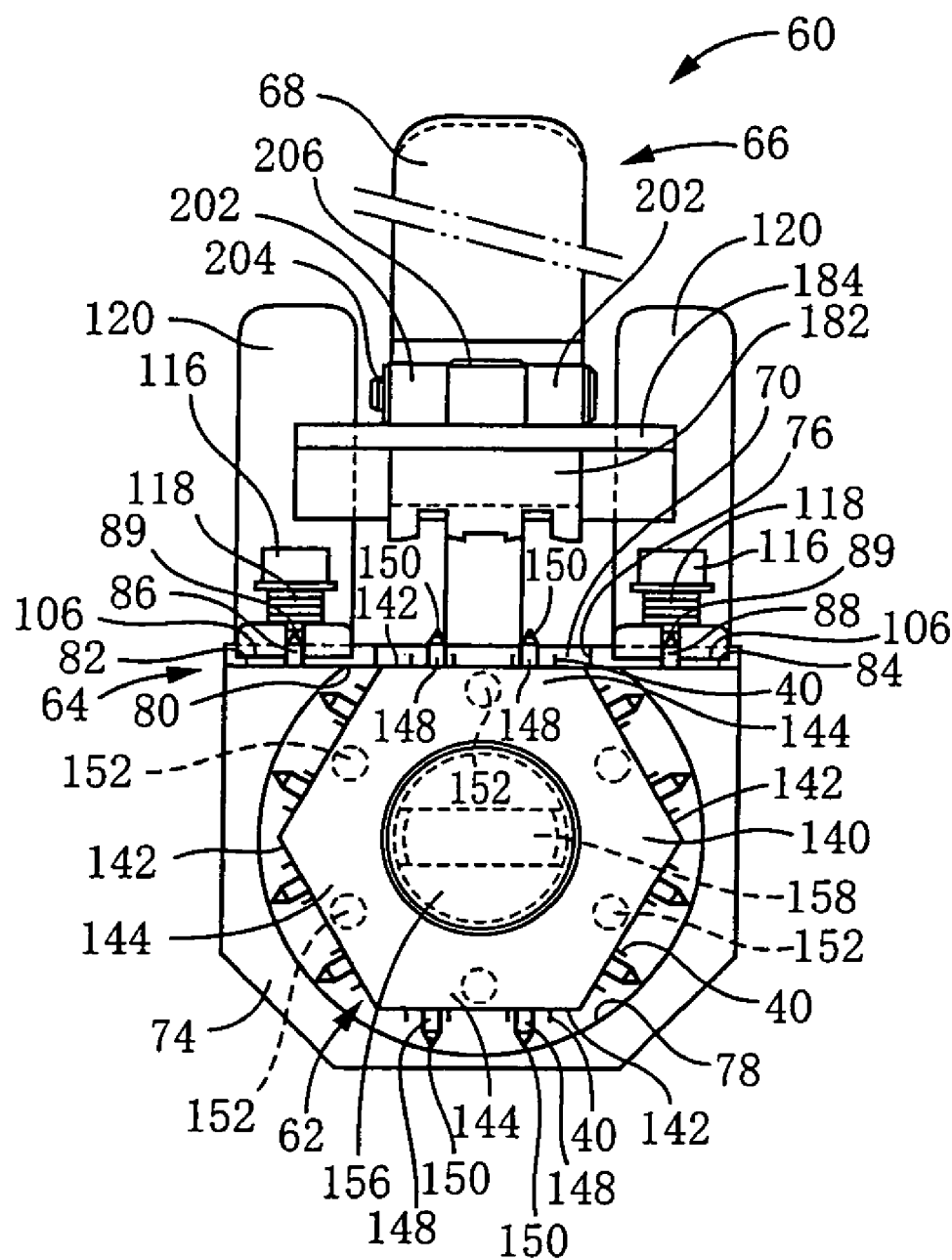
[FIG. 8] A side view showing the component-holding-tape connecting apparatus.

In the present embodiment, as shown in FIGS. 7-9, the holding body 74 is a provided by a block-like member, and has a width larger than that of the second operating lever 70. The holding body 74 constitutes a supplying-device holding portion or a rotary-body holding portion. The holding body 74 has a groove 76 at which the holding body 74 is fitted on the above-described other longitudinal end portion of the second operating lever 70. The holding body 74 is fixed to the second operating lever 70, and has a protrusion portion protruding from the second operating lever 70 by a small distance in the longitudinal direction of the second operating lever 70. The protrusion portion has a cutout formed through in parallel to a width direction of the second operating lever 70 (that is perpendicular to the longitudinal direction and thickness direction), and an end surface that lies on a plane on which a bottom surface of the groove 76 lies.

In the protrusion portion of the holding body 74 protruding from the second operating lever 70, a recessed portion 78 is provided to open in a protruding end or front surface of the protrusion portion so as to constitute a rotary-body storing portion. As shown in FIG. 8, the recessed portion 78 has a cross sectional shape defined by a circle whose outer peripheral portion is partially cut out, so that the recessed portion 78 has also an opening 80 that opens in an end surface lying in the plane in which the bottom surface of the groove 76 lies. The end surface is divided by the opening 80 into tape receiving surfaces 82, 84 that are located on opposite sides of the opening 80. Tape positioning protrusions 86, 88 as tape positioning members are provided to protrude from the respective tape receiving surfaces 82, 84. Each of the tape positioning protrusions 86, 88 has a circular shape in its transverse cross section, and includes a guide portion 89 that is provided by its distal end portion. The guide portion 89 is tapered to have a diameter that is reduced as viewed in a direction-toward a distal end of the tape positioning protrusion 86, 88. The tape positioning protrusions 86, 88 are spaced apart from each other by a spacing distance which is an integer number of times as large as a spacing pitch of the feed holes 32 of the component holding tape 10. The holding body 74 has also a fitting hole 90, as shown in FIG. 9, which opens in the recessed portion 78 and in a rear end surface of the holding body 74 (facing toward the handle 72). The fitting hole 90 is positioned to be coaxial with the above-described circle defining the cross sectional shape of the recessed portion 78. In respective portions constituting the bottom surface of the recessed portion 78 and lying on a circle whose center corresponds to a center of the fitting hole 90, a plurality of permanent magnet members 92 (five permanent magnet members) are fitted to be fixed.

As shown in FIGS. 7 and 8, a pair of tape presser members 100, 102 are provided in respective portions of the holding body 74 which are located on widthwise opposite sides of the second operating lever 70 and which correspond to the respective tape receiving surfaces 82, 84. Since the tape presser members 100, 102 have substantially the same construction, only the tape presser member 100 will be described as a representative of the two members 100, 102. As shown in FIG. 9, the tape presser member 100 is provided by a plate member that is bent to have a L shape. The tape presser member 100 includes a pressing portion 104 that is provided by an arm portion of the L-shaped plate member. The pressing portion 104 is fitted in a groove 106 that is provided in the holding body 74, and is movable in a direction parallel to the longitudinal direction of the second operating lever 70. As shown in FIG. 8, the groove 106 is formed to be shallower than the groove 76, and there is provided a clearance between the pressing portion 104 and the tape receiving surface 82, which clearance is smaller than the thickness of the carrier tape 20. The pressing portion 104 includes a bent portion provided by a distal end portion thereof that is bent in a direction away from the holding body 74. The bent portion constitutes a guide portion 108 of the pressing portion 104. A cutout 110 is provided in the pressing portion 104, so as to open in a distal end of the pressing portion 104 and extend in parallel to a direction in which the tape presser member 100 is movable. Owing to the cutout 110, an interference of the taper presser member 100 with the tape positioning protrusion 86 can be avoided.

As shown in FIG. 7, a movement amount of the tape presser member 100 is limited by a movement-amount limiting device that is provided by an engaging portion provided in one of the pressing portion 104 and the second operating lever 70 and an engaging portion provided in the other of the pressing portion 104 and the second operating lever 70. In the present embodiment, an elongated hole 114 provided in the pressing portion 104 serves as the engaging portion provided in the one of the pressing portion 104 and the second operating lever 70, while a bolt 116 provided in the second operating lever 70 serves as the engaging portion provided in the other of the pressing portion 104 and the second operating lever 70. The bolt 116 includes a shank portion that is fitted in the elongated hole 114 such that the bolt 116 is movable relative the elongated hole 114 in the longitudinal direction of the elongated hole 114. The tape presser member 100 is movable between its pressing or working position in which the pressing portion 104 is fitted at the cutout 110 on the tape positioning protrusion 86 so as to be position on the tape receiving surface 82 for pressing the component holding tape 10, and its releasing or non-working position in which the pressing portion 104 is disengaged from the tape positioning protrusion 86 so as to release the tape receiving surface 82 or the component holding tape 10.

As shown in FIG. 8, a compression coil spring 118 serving as an elastic member as a kind of a biaser is fitted on the shank portion of the bolt 116 protruding from the pressing portion 104, so that the pressing portion 104 is biased in a direction toward the tape receiving surface 82. The other arm portion of the tape presser member 100 provided by the L-shaped plate member is arranged to extend perpendicularly from the second operating lever 70, so as to constitute an operating portion 120. In the present embodiment, the tape receiving surfaces 82, 84, tape positioning protrusions 86, 88, tape presser members 100, 102 and other elements cooperate to constitute the holding device 64.

The above-described supplying device 62 will be described.

The supplying device 62 includes a rotary body 140, as shown in FIGS. 8 and 9. In the present embodiment, the rotary body 140 is provided by a plate member which is made of a ferromagnetic material such as steel and which has a regular polygonal shape such as regular hexagonal shape in its transverse cross section. On an outer circumferential surface of the rotary body 140, a plurality of for example, six metallic-connecting-member receiving surfaces 142 are provided to be equi-angularly spaced apart from each other, so that metallic-connecting-member holding portions 144 are constituted by portions of the rotary body 140 in which the six metallic-connecting-member receiving surfaces 142 are provided. Thus, the rotary body 140 has, in its outer circumferential surface, the plurality of (in the present embodiment, six) metallic-connecting-member holding portions 144. Each of the six connecting-member receiving surfaces 142 is elongated in a circumferential direction of the rotary body 140, and is longer than the connecting member 40. A plurality of, for example, two metallic-connecting-member positioning protrusions 148 as metallic-connecting-member positioning members are provided to protrude from each of the connecting-member receiving surfaces 142. Each of the connecting-member positioning protrusions 148 includes a guide portion 150 which is provided by its distal end portion and which is tapered to have a diameter that is reduced as viewed in a direction toward a distal end of the protrusion 148. Centers of the respective two metallic-connecting-member positioning protrusions 148 are spaced apart from each other by a distance which is equal to a distance between centers of respective opposite-side two of the three positioning holes 44 of the connecting member 40 and which is twice as large as a spacing pitch of the feed holes 32 of the component holding tape 10.

A permanent magnet member 152 is fixed to each of the six metallic-connecting-member holding portions 144 of the rotary body 140, so as to be held in proximity to the corresponding metallic-connecting-member receiving surface 142. The magnet member 152 is fitted in a portion of the rotary body 140 which is located between the two metallic-connecting-member positioning protrusions 148 and corresponds to the longitudinally intermediate portion of the corresponding metallic-connecting-member receiving surface 142. The magnet members 152, whose number is the same as that of the connecting-member holding portions 144, are disposed to be spaced apart from each other by an angular interval which is equal to an angular interval of the dispositions of the six metallic-connecting-member holding portions 144 and which is equal to an angle of one rotational motion of the rotary body 140. In each of the six metallic-connecting-member receiving surfaces 142, the connecting member 40 is positioned with the opposite-side two positioning holes 44 being fitted on the pair of connecting-member positioning protrusions 148, and is detachably fixed to the connecting-member receiving surface 142 owing to a magnetic force of the magnet member 152. The rotary body 140 is made of the ferromagnetic material, so that the connecting-member receiving surfaces 142 are magnetized by the magnet members 152, whereby the connecting members 40 made of the ferromagnetic material are firmly fixed to the connecting-member receiving surfaces 142 owing to the magnetic force. The six metallic-connecting-member holding portions 144 hold the respective connecting members 40 each having an elongated shape such that a longitudinal direction of each connecting member 40 corresponds to a circumferential direction of the rotary body 140. Since each connecting member 40 is held by the corresponding connecting-member holding portion 144 owing to the magnetic force, the connecting member 40 can be easily attached and detached to and from the connecting-member holding portion 144, by moving the connecting member 40 relative to the connecting-member holding portion 144 in a direction parallel to the axis of each connecting-member positioning protrusion 148.

As shown in FIG. 9, a shaft 156 is provided to project from the rotary body 140 such that the shaft 156 and the rotary body 140 are coaxial with each other. The rotary body 140 is rotatably fitted at the shaft 156 in the fitting hole 90 of the holding body 74. In this state, the rotary body 140 is received in the recessed portion 78 of the holding body 74, while being attracted by the holding body 74 owing to the magnetic force of each of the magnet members 152, 92 are provided in the rotary body 140 and the holding body 74, so as to be detachably held by the holding body 74. Each magnet member 92 is provided in the holding body 74 with its N pole and S pole being arranged in a direction parallel to the center line of the fitting hole 90, while each magnet member 152 is provided in the rotary body 140 with its N pole and S pole being arranged in a direction parallel to the rotary axis of the rotary body 140, such that one of the N and S poles of the magnet member 92 is opposed to the other of the N and S poles of the magnet member 152, whereby the magnet members 92, 152 are attracted to each other. In the present embodiment in which the rotary body 140 is made of the ferromagnetic material, it is possible to obtain an attraction force causing the rotary body 140 to be attracted to the magnet member 92 so as to be held by the holding body 74, even where the magnet members 152, 92 are not just opposed to each other and are not aligned with each other in the circumferential direction of the rotary body 140.

In the present embodiment, each of the six magnet members 152 is positioned in the position corresponding to the longitudinally intermediate portion of the corresponding connecting-member receiving surface 142, as described above. Five of the six magnet members 92 are just opposed to respective five of the six magnet members 152, with one of the six connecting members 40 held by the rotary body 140 being positioned in a caulking position. Thus, the rotary body 140 is positioned in any one of positions each of which causes a corresponding one of the six connecting members 40 to be positioned in the caulking position. The caulking position is a position which causes a corresponding one of the six connecting-member receiving surfaces 142 to lie on a plane on which the tape receiving surfaces 82, 84 lie, and causes the two connecting-member positioning protrusions 148 to be positioned on a straight line passing through the axes of the respective tape positioning protrusions 86, 88 and to be spaced apart from the respective tape positioning protrusions 86, 88 by a distance which is an integer number of times as large as a spacing pitch of the feed holes 32 of the component holding tape 10, when one of the connecting members 40 is positioned in the caulking position. In the present embodiment in which the caulking position is a predetermined position, when one of the connecting members 40 is positioned in the caulking position, the corresponding connecting-member holding portion 144 holding the connecting members 40 in question is also positioned in the caulking position. In the present embodiment, since a shaft holding portion is provided in a portion of the holding body 74 that corresponds to the caulking position, as described below, the five magnet members 92 are provided in respective positions opposed to the five magnet members 152 other than the magnet member 152 that is provided in the connecting-member holding portion 144 holding the connecting member 40 positioned in the caulking position. The attraction force is maximized when each of the magnet members 152 is just opposed to a corresponding one of the magnet members 92, whereby the angular positions in which the rotary body 140 is to be positioned are determined. Each of the magnet members 152 functions as a holding member for causing the connecting member 40 to be detachably held by the rotary body 140, and also functions as a positioning member for positioning the rotary body 140 or as a holding member for generating a large force by which the rotary body 140 is held in the angular positions. The shaft 156 includes a protrusion portion protruding from the fitting hole 90, and has an operating portion 158 provided by a diametrically extending projection which is formed in a distal end of the protrusion portion.

The above-described caulking device 66 will be described.

As shown in FIG. 9, the caulking device 66 has a caulking tool 182 in addition to the first and second operating levers 68, 70. The caulking tool 182 is attached to the second operating lever 70 through a holding lever 184 as a holding member. The holding lever 184 is provided by an elongated-shaped plate member fixed at one of its longitudinally opposite end portions to an upper surface of the end portion the second operating lever 70 that provides the handle 72. The upper surface is one of opposite surfaces of the second operating lever 70 that is remote from the holding body 74. Meanwhile, the holding lever 184 provided by the elongated-shaped plate member is bent in a direction causing the other longitudinal end portion of the holding lever 184 that extends toward the rotary body 140, to be separated from the second operating lever 70, so that the other longitudinal end portion of the holding lever 184 is elastically pivotable. The caulking tool 182 is detachably fixed to the other longitudinal end portion of the holding lever 184, i.e., to a projecting end portion of the holding lever 184. As shown in FIG. 10, the caulking tool 182 has a plurality of (in the present embodiment, four) presser surfaces 188 that are arranged in a row in a direction parallel to the circumferential direction of the rotary body 140. The four presser surfaces 188 consist of two pairs of the presser surfaces 188 such that each pair of the presser surfaces 188 are adjacent to each other. Between each adjacent pair of the presser surfaces 188, there is provided a recessed portion 190, so that the caulking tool 182 is avoided from interfering with the connecting-member positioning protrusions 148. Two of the four presser surfaces 188, which are located in respective opposite end portions of the caulking tool 182, are inclined symmetrically with each other with respect to a plane perpendicular to a pivot axis about which the holding lever 184 is pivotable. That is, the two presser surfaces 188 are surfaces which are inclined with respect to the connecting-member receiving surface 142, when being opposed to the connecting-member receiving surface 142.

As shown in FIG. 9, the first operating lever 68 is provided by an elongated-shaped plate member, and is pivotably attached to the second operating lever 70. As shown in FIGS. 7 and 8, the first operating lever 68 has a pair of cylindrical fitting portions 202 located in one of longitudinally opposite end portions thereof. The fitting portions 202 are pivotably fitted on a shaft 204 that is provided in the second operating lever 70. A shaft holding portion 206 is provided to project from the holding body 74 and pass through the second operating lever 70 and an opening 208 provided in the holding lever 184. The shaft holding portion 206 has a projecting end portion to which the shaft 204 is attached. Thus, the first operating lever 68 is attached to the shaft holding portion 206, pivotably about an axis which is parallel to a width direction of the component-holding-tape connecting apparatus 60 and which is perpendicular to the rotary axis of the rotary body 140 without intersecting with the rotary axis of the rotary body 140. The second operating lever 70, to which the holding body 74 is fixed, constitutes main bodies of the holding device 64 and caulking device 66, and can be considered to constitute a main body of the component-holding-tape connecting apparatus 60.

In a front end portion or connected portion of the first operating lever 68 at which the first operating lever 68 is pivotably connected to the second operating lever 70, an engaging portion 210 is further provided on the side of the holding lever 184, so as to constitute an operating portion. The engaging portion 210 has an engaging surface 212 that is linearly inclined in a direction that causes a distance of the engaging surface 212 from the first operating lever 68, to be increased as viewed in a direction away from a portion of the first operating lever 68 corresponding to the pivot axis toward a free end portion of the first operating lever 68. Therefore, while the first operating lever 68 is being released without a force applied thereto, the holding lever 184 is pivoted owing its own elastic restoring force, whereby the caulking tool 182 is separated from the rotary body 140, while the engaging surface 212 in its entirety is brought into engagement with the holding lever 184, thereby inhibiting free pivot motion of the first operating lever 68.

There will be described an operation performed by the component-holding-tape connecting apparatus 60, to connect two component holding tapes 10.

When the component-holding-tape connecting apparatus 60 is not performing the connecting operation, the first and second operating levers 68, 70 are placed in their respective non-operating positions while the caulking tool 182 is placed in its non-working position, as shown in FIG. 9. Further, the connecting member 40 is supplied to be positioned in the caulking position, and the tape positioning protrusions 86, 88 are spaced apart from the respective two connecting-member positioning protrusions 148 of the connecting-member holding portion 144 that is positioned in the caulking position, by a distance which is an integer number of times as large as the spacing pitch of the feed holes 32 of the component holding tape 10, as shown in FIG. 8.

The two component holding tapes 10, which are to be connected to each other, are first set on the component-holding-tape connecting apparatus 60 by the operator. In setting of the two tapes 10, for example, one of the two tape presser members 100, 102, e.g., the tape presser member 100 is retracted from its pressing position to its retracted position, and one of the two metallic-connecting-member positioning protrusions 148 of the connecting-member holding portion 144 holding the connecting member 40 supplied to the caulking position, which one is closer to the taper presser member 100, is fitted into a trailing end feed hole 32 of the trailing end portion 37 of the component holding tape 10 that is currently supplying the components 12. The trailing end feed hole 32 fitted on the above-described one of the connecting-member positioning protrusions 148, is a complete feed hole 32 that is adjacent to a non-complete or almost half feed hole 32 whose center substantially lies on a trailing end of the component holding tape 10. That is, the trailing end of the component holding tape 10 is defined by a cut line passing through substantially the center of the non-complete feed hole 32. Further, the tape positioning protrusion 86 is fitted into another feed hole 32 that is located on a leading side of the above-described complete feed hole 32, whereby the trailing end portion 37 is positioned in parallel to the longitudinal direction of the connecting member 40. In this instance, the tape positioning protrusion 86 and the connecting-member positioning protrusions 148 are fitted into the feed holes 32, with the bottom surface 30 of the component holding tape 10 facing the tape receiving surface 82 and the connecting member 40, so that the trailing end portion 37 of the component holding tape 10 is received at the bottom surface 30 on the tape receiving surface 82. Then, the tape presser member 100 is moved to the pressing position, after the protrusions 86, 148 have been introduced into the feed holes 32. A distance between the pressing portion 104 of the tape presser member 100 and the tape receiving surface 82 and a distance between the pressing portion 104 of the tape presser member 102 and the tape receiving surface 84 are adapted to be smaller than the thickness of the carrier tape 20, in absence of the component holding tape 10 that is to be set therebetween. The pressing portion 104 is raised against a biasing force of the spring 118 so as to be mounted on the carrier tape 20 that is guided by a curved surface of the guide portion 108. Thus, the carrier tape 20 is gripped and held by and between the tape receiving surface 82 and the pressing portion 104 that is biased by the spring 118 toward the tape receiving surface 82. It is noted that the connecting-member positioning protrusions 148 may be introduced into the trailing end feed hole 32 after the tape positioning protrusion 86 has been introduced into the feed hole 32.

Next, the tape presser member 102 is moved to its retracted position, for setting the leading end portion 38 of the component holding tape 10 that is subsequently assigned to supply the components 12. In this component holding tape 10, too, a leading end of the tape 10 as well as the trailing end of the tape 10 is defined by a cut line passing through substantially the center of the feed hole 32. The other of the two connecting-member positioning protrusions 148 of the connecting-member holding portion 144 holding the connecting member 40 supplied to the caulking position, which is closer to the taper presser member 102, is fitted into a leading end feed hole 32 of the leading end portion 38 of the component holding tape 10. The leading end feed hole 32 is a complete feed hole 32 that is adjacent to the non-complete feed hole 32 whose center substantially lies on the leading end of the tape 10. Further, the tape positioning protrusion 88 projecting from the tape receiving surface 84 is fitted into another feed hole 32 that is located on a trailing side of the leading end feed hole 32, whereby the leading end portion 38 is positioned. In this instance, the bottom surface 30 of the component holding tape 10 faces the tape receiving surface 84. After the tape positioning protrusion 88 and the connecting-member positioning protrusions 148 have been thus introduced into the feed holes 32, the tape presser member 102 is moved to its pressing position, whereby the leading end portion of the carrier tape 20 is pressed and held by the tape presser member 102. In the present embodiment, the connecting-member holding portion 144 as a part of the rotary body 140, which holds the connecting member 40 supplied to the caulking position, serves to position the component holding tapes 10 by the connecting-member positioning protrusions 148 so as to constitute a part of the holding device 64. Each of the connecting-member positioning protrusions 148 functions also as a tape positioning member. It is noted that the operation of setting of the component holding tapes 10 may be carried out in a suitably modified manner, for example, such that the two component holding tapes 10 are concurrently set while the tape presser members 100, 102 are both being positioned in their retracted positions.

Even if the connecting member 40 is positioned in a position deviated from the caulking position, the position of the connecting member 40 is corrected when the component holding tapes 10 are set. Where the position of the connecting member 40 is deviated from the caulking position, the rotary body 140 is rotated in accordance with the spacing pitch of the feed holes 32, for positioning the connecting member 40 into a position that permits the tape positioning protrusion 86 (88) and the connecting-member positioning protrusion 148 to be fitted into one and the other of two feed holes 32 of the trailing end portion 37 or leading end portion 38 of the component holding tape 10, whereby the connecting member 40 is positioned in the caulking position. Therefore, it is not essential for provision of a positioning device for positioning the rotary body 140 in each of positions that causes a corresponding one of the plurality of connecting members 40 to be positioned in the caulking position.

In a state in which the two component holding tapes 10 are set on the component-holding-tape connecting apparatus 60, one of the opposite-side two of the positioning holes 44 of the connecting member 40 and the complete feed hole 32 of the trailing end portion 37 of the component holding tape 10 are aligned with each other, while the other of the opposite-side two of the positioning holes 44 of the connecting member 40 and the complete feed hole 32 of the leading end portion 38 of the component holding tape 10 are aligned with each other, so that the almost half feed holes 32 which are formed in the trailing and leading ends of the respective two component holding tapes 10 are aligned with a central one of the positioning holes 44 of the connecting member 40. Further, the caulking claws 46 are positioned in a position intermediate between each of the complete feed holes 32 and the half feed hole 32 and in a position intermediate between the complete feed holes 32, so that the carrier tapes 20 are mounted on the caulking claws 46 whereby the setting is completed. Thus, the two component holding tapes 10 are positioned by the tape positioning protrusions 86, 88 and the connecting-member positioning protrusions 148, and are held in the caulking position together with the connecting member 40 that is positioned by the connecting-member positioning protrusions 148. The two component holding tapes 10 intersect with the longitudinal direction of the component-holding-tape connecting apparatus 60, and are held perpendicular to the longitudinal direction of the apparatus 60. The portions of the respective component holding tapes 10, in which the feed holes 32 are provided, are gripped from one of opposite sides of the tapes 10 in a width direction that is a direction perpendicular to the longitudinal direction of the component holding tapes 10.

Next, the first and second operating levers 68, 70 are gripped by the operator, and are pivoted in a direction toward each other, so that the holding lever 184 is pressed by the engaging portion 210 whereby the caulking tool 182 is caused to approach the two component holding tapes 10 and the connecting member 40. By this approach, the two component holding tapes 10 are pressed at their surfaces 29 by the presser surfaces 188, whereby the caulking claws 46 are caused to pierce through thickness of the component holding tapes 10. Thus, distal end portions of the caulking claws 46 protrude to the side of the surfaces 29, and are brought into contact with the presser surfaces 188. In the present embodiment in which the connecting member 40 has four pairs of caulking claws 46, two pairs of caulking claws 46, i.e., four caulking claws 46 located in one longitudinal side portion of the connecting member 40 are caused to pierce through the trailing end portion 37 of the component holding tape 10, while the other two pairs of caulking claws 46, i.e., the other four caulking claws 46 located in the other longitudinal side portion of the connecting member 40 are caused to pierce through the leading end portion 38 of the component holding tape 10. When the first operating lever 68 is further pivoted so as to cause the caulking tool 182 to approach the connecting-member receiving surface 142, the caulking claws 46 are pressed by and between the presser surfaces 188 and the connecting-member receiving surface 142, whereby upper end portions of the caulking claws 46 are bent by the presser surface 188 so as to be completely clinched. The main body portion 42 of the connecting member 40 is brought into close contact with the bottom surface 30 of each component holding tape 10, while the portion of each caulking claw 46 projecting on the side of the top surface 29 of each component holding tape 10 is completely clinched, so that the two component holding tapes 10 are firmly connected to each other. The caulking claws 46 are clinched on the top surface 29 of each component holding tape 10. In this instance, the distal end portions of the connecting-member positioning protrusions 148 provided in the connecting-member receiving surface 142 protrude from the top surface 20 of each component holding tape 10. However, the protruding distal end portions of the connecting-member positioning protrusions 148 are received in the recessed portions 190 provided between the presser surfaces 188, so that the approach of the presser surfaces 188 to the connecting-member receiving surface 142 is not impeded. The connecting-member receiving surface 142 constitutes the supplying device 162, and constitutes a part of the caulking device 66.

The engaging surface 212 has an inclination angle and a length which are sufficient for the first operating lever 68 to cause the holding lever 184 to be pivoted by an angle sufficient for causing the caulking tool 182 to caulk the connecting member 40, and sufficient for the first operating lever 68 to obtain an operating stroke causing the holding lever 184 to be pivoted by an angle sufficient for the caulking of the connecting member 40. A operating force applied to the first operating lever 68 is boosted based on a ratio of a length of the first operating lever 68 to a distance between a pivot axis of the first operating lever 68 and a portion of the engaging surface 212 which is brought into engagement with the holding lever 184 when the caulking claws 46 are clinched, whereby the claws 46 are sufficiently clinched. It can be considered that the engaging portion 210 constitutes a cam causing the holding lever 184 to be pivoted as a result of pivot motion of the first operating lever 68, and that the engaging surface 212 constitutes a cam surface. The caulking tool 182 is held by the holding lever 184, such that the presser surfaces 188 are not inclined with respect to the connecting-member receiving surface 142 about a pivot axis of the holding lever 184 so that the caulking claws 46 are pressed by the presser surfaces 188 evenly in the width direction of the connecting member 40, when the caulking claws 46 are completely clinched.

After the two component holding tapes 10 have been thus connected to each other, the holding lever 184 is pivoted owing to its elastic restoring force, as a result of release of the force applied to the first and second operating levers 68, 70. The pivot motion of the holding lever 184 owing to the elastic restoring force causes the caulking tool 182 to be moved to its non-working position so as to be separated from the component holding tapes 10, and causes the first and second operating levers 68, 70 to be returned to their respective non-operating positions, for thereby allowing removal of the two connected component holding tapes 10 from the component-holding-tape connecting apparatus 60. When the component holding tapes 10 are to be removed from the apparatus 60, the tape presser members 100, 102 are retracted to their respective retracted positions, and the two component holding tapes 10 connected through the connecting member 40 are disengaged from the tape positioning protrusions 86, 88 and the connecting-member positioning protrusions 148.

After the removal of the component holding tapes 10 from the apparatus 60, the operating portion 158 is operated by the operator so as to rotate the rotary body 140 for supplying connecting members 40 one by one, which are to be used for the subsequent connections of the component holding tapes 10, to the caulking position. As described above, since the rotary body 140 is held by the holding body 74 owing to the magnetic force of each of the magnet members 152, 92, the rotary body 140 is rotated by the operator against the magnetic force. With rotation of the rotary body 140, the magnet members 152, 92 are offset in phase from each other. However, since the rotary body 140 is made of the ferromagnetic material, the rotary body 140 can be rotated while being held by the holding body 74 owing to the magnetic force of each magnet member 92. When each of the connecting members 40 approaches the caulking position, the magnet members 152, 92 are brought into proximity with each other, thereby increasing the attraction force. The increase of the attraction force leads to increase of force required to rotate the rotary body 140, thereby letting the operator to know that one of the connecting members 40 has almost reached the caulking position. The operation of supply of the connecting member 40 to the caulking position may be done either before or during the next connecting operation.

When all the connecting members 40 held by the rotary body 140 have been used for the connection of the component holding tapes 10, the rotary body 140 is replaced with another rotary body 140. Thus, the replenishment of the component-holding-tape connecting apparatus 60 with the connecting members 40 can be easily made by the replacement of the rotary body 140. The rotary body 140 is removed from the holding body 74, by moving the rotary body 140 against the magnetic force of each of the magnet members 152, 92 in a direction causing the rotary body 140 to be pulled out of the recessed portion 78. Then, the another rotary body 140 holding the connecting members 40 is fixed to the holding body 74 owing to the magnetic force, by fitting the shaft 156 of the another rotary body 140 into the fitting hole 90 of the holding body 74. Further, one of the plurality of connecting members 40 is positioned to be supplied to the caulking position.

It is noted that the cover tapes 22 of the respective two component holding tapes 10 are connected to each other, for example, by using a connector such as adhesive and sticker tapes which is provided to bridge between portions of the respective two cover tapes 22 constituting the trailing and leading end portions of the component holding tapes 10, so as to be adhered to these portions. The connector may be adhered to these portions either before or after the connection of the carrier tapes 20 through the connecting member 30, while the two component holding tapes 10 are being held by the holding device 64. Alternatively, the connector may be adhered to the above-described portions after the connection of the carrier tapes 20 through the connecting member 30, while the two component holding tapes 10 are being separated from the holding device 64.

While there has been described the connection of the component holding tapes 10 of so-called paper-sheet type, it should be noted that component holding tapes of emboss type can be connected by the above-described component-holding-tape connecting apparatus 60. Each of the component holding tapes of emboss type includes emboss portions in each of which a component storing portion is provided. Each of the emboss portions protrudes from a portion in which the feed holes are formed, in a direction of thickness of the portion in which the feed holes are formed. However, since an open space is provided in a front side of the rotary body 140 (one of opposite sides of the rotary body 140 remote from the holding body 74), the component holding tapes of emboss type can be set on the component-holding-tape connecting apparatus 60 so as to be connected through the connecting member 40, without risk of interference of the emboss portions with other member, which could damage the emboss portion.

There will be described another embodiment with reference to FIGS. 11-19. It is noted that elements providing the same effects as elements described in the above-described embodiment will be described by using the same reference signs as needed.

Figure 17:
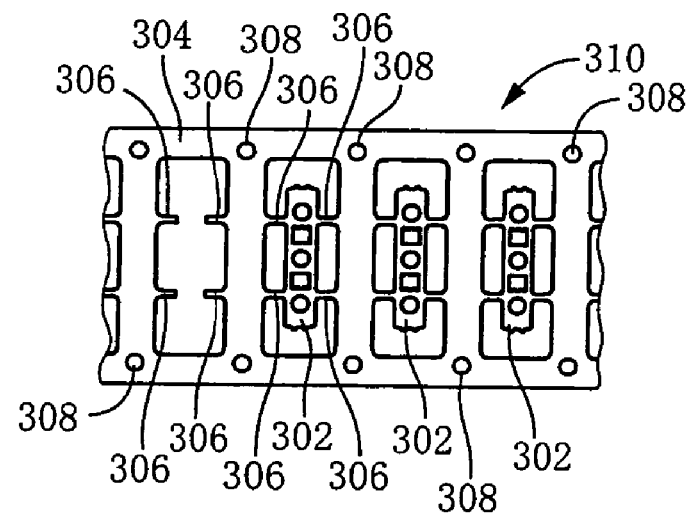
[FIG. 17] A plan view showing a part of a strip body in which a holding member holding metallic connecting members that are to be used in the component-holding-tape connecting apparatus shown in FIG. 11.

A metallic connecting members (splicing fitting) 302 used for the connection of the two component holding tapes 10 in a component-holding-tape connecting apparatus 300 of the present embodiment has the same construction as the above-described metallic connecting member 40. The plurality of metallic connecting members 302 are equally spaced apart from each other, and are held by a holding member 304 which has an elongated shape, as shown in FIG. 17. The holding member 304 is formed integrally with the connecting members 302 to which the holding member 304 is partially connected, through an operation in which a metal-strip made of a ferromagnetic material such as a steel is punched. A strip body 310 in which the plurality of connecting members 302 held by the holding member 304 to be equally spaced apart from each other is set on the component-holding-tape connecting apparatus 300, so that each of the connecting members 302 is supplied and is cut off from the holding member 304, so as to be used for the connection of the component holding tapes 10.

Each of the plurality of connecting members 302 is partially held by the holding member 304 through a plurality of bridging portions 306, such that a longitudinal direction of the connecting member 302 is parallel to a width direction of the holding member 304 and is perpendicular to a longitudinal direction of the holding member 304. In the present embodiment, each of the bridging portions 306 is provided to bridge the holding member 304 and a portion of the main body portion 42 of the corresponding connecting member 302, which portion is located between one of the positioning holes 44 located in a longitudinal end portion of the main body portion 42, and the caulking claws 46 adjacent to the one positioning hole 44 and closer to a longitudinally central portion of the main body portion 42 than the one positioning hole 44. That is, the bridging portions 306 bridge the holding member 304 and four portions of the connecting member 302 each of which is located between two pairs of caulking claws 46 that are located in a corresponding one of longitudinally opposite side portions of the connecting member 302. The holding member 304 has engaged portions in the form of feed holes 308 which are located in each of widthwise opposite end portions elongated in a direction parallel to the longitudinal direction of the holding member 304 and which are equally spaced apart from each other. In the present embodiment, the feed holes 308 are arranged at a spacing pitch that is equal to a spacing pitch by which the connecting members 302 are held by the holding member 304. Each of the feed holes 308 is located in a position intermediate between each pair of the connecting members 302 that are adjacent to each other.

Figure 11:
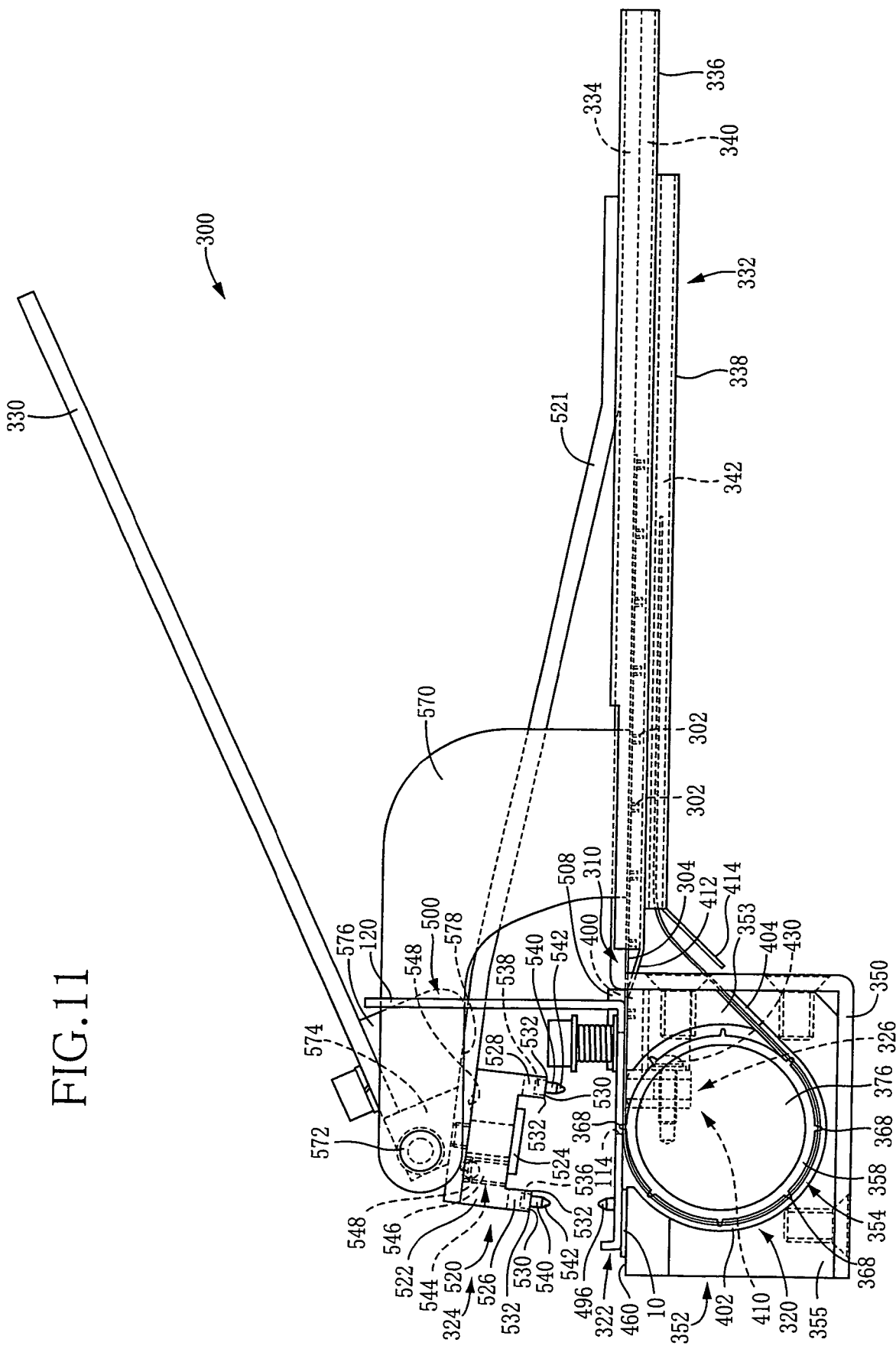
[FIG. 11] A front view showing a component-holding-tape connecting apparatus as another embodiment of the claimable invention.

The component-holding-tape connecting apparatus 300 has a supplying device 320, a holding device 322, a caulking device 324 and a cutting-off device 326, as shown in FIG. 11.

Figure 16:
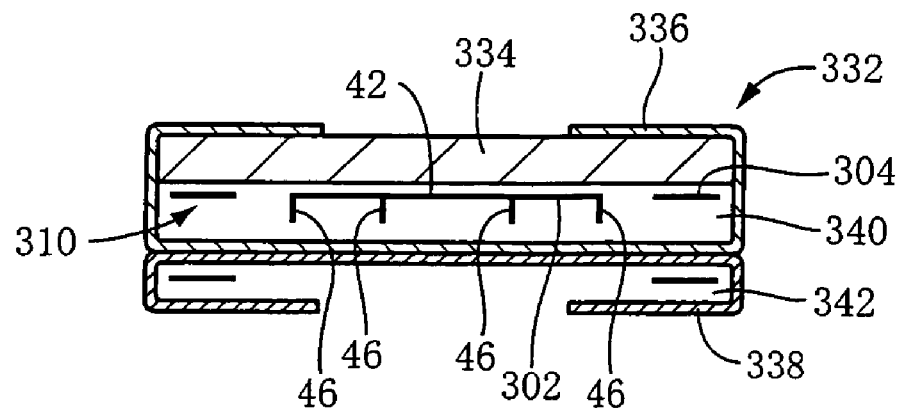
[FIG. 16] A side cross sectional view showing first and second guide passages of the component-holding-tape connecting apparatus shown in FIG. 11.

The caulking device 324 is operated by operating members in the form of a first operating lever 330 and a second operating lever 332. In the present embodiment, the second operating lever 332 includes a first member 334, a second member 336 and a third member 338 that are integrally assembled to each other. Each of the first, second and third members 334, 336, 338 has an elongated shape. A part of the first member 334 cooperates with the second member 336 to define a first guide passage 340 which opens in longitudinally opposite ends of the second member 336 and which guides a portion of the strip body 310 in which the connecting members 302 are not yet separated from the holding member 304. The first guide passage 340 allows passing of the portion of the strip body 310 therethrough. The third member 338 defines a second guide passage 342 which opens in longitudinally opposite ends of the third member 338 and which guides another portion of the strip body 310 in which the connecting members 303 have been separated from the holding member 304. The second guide passage 342 allows passing of the another portion of the strip body 310 therethrough. As shown in FIGS. 11 and 16, the first and second guide passages 340, 342 are parallel to each other, and extend in parallel to a longitudinal direction of the second operating lever 332. The first and second guide passages 340, 342 are arranged to overlap with each other in their height (thickness) direction and width direction. The first guide passage 340 constituting a first guide portion and the second guide passage 342 constituting a second guide portion cooperate with each other to constitute the second operating lever 332.

Figure 12:
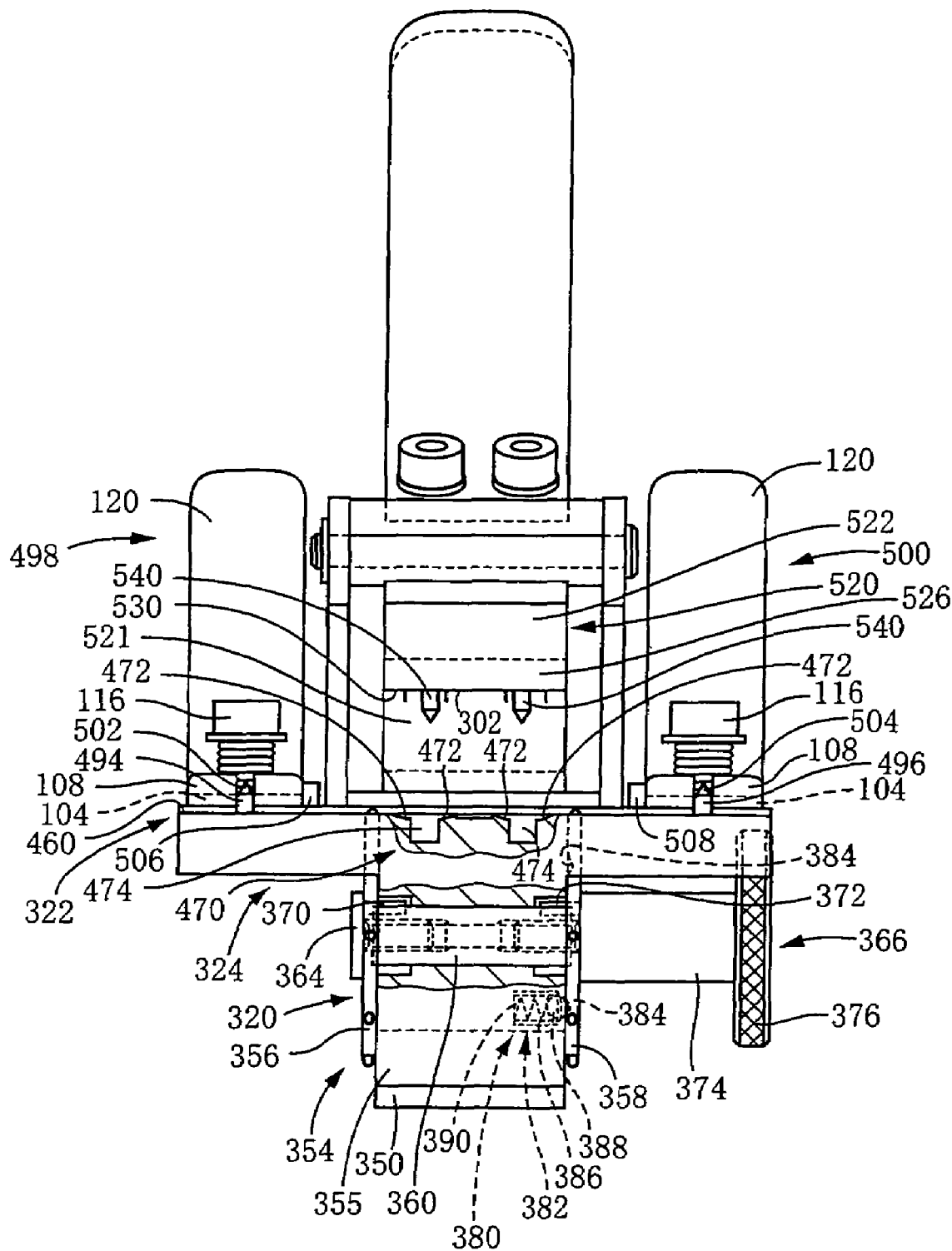
[FIG. 12] A side view (partly in cross section) showing the component-holding-tape connecting apparatus shown in FIG. 11.

The first member 334 includes an attachment portion 350 provided by its longitudinal end portion to which the second and third members 336, 338 are not assembled. The attachment portion 350 cooperates with first and second holding bodies 353, 355 that are attached thereto, to constitute a holding portion 352. In the present embodiment, the holding portion 352 includes a plurality of members each detachably fixed to the attachment portion 350 by suitable fixing means such as bolts. In the present embodiment, as shown in FIG. 11, the holding portion 352 includes the first and second holding bodies 353, 355. In the first holding body 353, a first rotary body 354 is attached rotatably about an axis that is parallel to a width direction of the component-holding-tape connecting apparatus 300 (in a direction perpendicular to the drawing sheet of FIG. 11). As shown in FIG. 12, the first rotary body 354 includes a pair of rotary engaging members 356, 358 as a pair of feed members and a rotary shaft 360 to which the rotary engaging members 356, 358 are fixed. The rotary shaft 360 is rotatably held by the first holding body 353, and an axially opposite end portions which slightly protrude from the first holding body 353 and on which the rotary engaging members 356, 358 are respectively fitted. The rotary engaging members 356, 358 are detachably fixed to the rotary shaft 360 by screw members 364, 366 as a kind of fixture, so as be coaxial with each other and distant from each other in a direction parallel to an axis of the rotary shaft 360.

Each of the rotary engaging members 356, 358 is provided by a plate member having a circular shape in its transverse cross section. In an outer circumferential surface of each of the rotary engaging members 356, 358, a plurality of feed protrusions 368 are equi-angularly provided to serve as engaging portions that are to be brought into engagement with the respective feed holes 308 of the holding member 304. Into each of the rotary engaging members 356, 358 having a wheel-like shape, a corresponding one of pins 370, 372 constituting phase establishing means are fitted, for establishing a phase of each of the rotary engaging members 356, 358 relative to the rotary shaft 360 and also a phase of each of the rotary engaging members 356, 358 relative to the other of the rotary engaging members 356, 358. In the preset embodiment, each of the plurality of feed protrusions 368 of the rotary engaging member 356 coincides in phase with a corresponding one of the feed protrusions 368 of the rotary engaging member 358. The screw member 366 as one of the screw members 364, 366 has a shank portion 374 projecting from the rotary engaging member 358 as shown in FIG. 12. The shank portion 374 has a head portion provided by its projecting end portion and having a large diameter. The head portion constitutes an operating portion 376, which is to be gripped by the operator to rotate the first rotary body 354 for rotating the rotary engaging members 356, 358 together with each other.

The first rotary body 354 is positioned in its angular position by an angular-position positioning device 380. In the present embodiment, the angular-position positioning device 380 includes an engaging portion in the form of a ball plunger 382 provided in the first holding body 353, and an engaged portion in the form of a plurality of recessed portions 384 provided in, for example, the rotary engaging member 358 as one of the rotary engaging members 356, 358. In the ball plunger 382, a ball 388 is accommodated within a casing 386, so as to be movable and not removable from the casing 386. The ball 388 is biased by a spring 390 as a kind of biaser in a direction causing the ball 388 to protrude from the casing 386, so that a part of the ball 388 protrudes from the casing 386.

In the present embodiment, the plurality of recessed portions 384 are provided in the same number as the feed protrusions 368 of each of the rotary engaging members 356, 358. The recessed portions 384 are arranged on a circumference whose center corresponds to the rotary axis of the rotary engaging member 356, at a constant angular interval that is equal to an angular interval by which the plurality of feed protrusions 368 are angularly spaced apart from each other. With the ball 388 being fitted into one of the recessed portions 384, the first rotary body 354 is positioned in a certain angular position. In the present embodiment, the plurality of recessed portions 384 and the ball plunger 382 are arranged to cooperate to position the first rotary body 354 in a plurality of angular positions each of which causes a corresponding one of the plurality of feed protrusions 368 of each of the rotary engaging members 356, 358 to be positioned on a plane containing the rotary axis of the first rotary body 354 and perpendicular to a direction of feed of the connecting members 302 and to protrude upward from the corresponding rotary engaging member 356, 358, as shown in FIG. 11.

In the first holding body 353, there is provided a passage 400 allowing movement of each connecting member 302 that is held by the holding member 304 to have an attitude causing the caulking claws 46 to project downward. The passage 400 is provided to extend from the first rotary body 354 in parallel to a direction in which the holding member 304 is guided by the first guide passage 340, and is contiguous to the first guide passage 340. The first and second holding bodies 353, 355 cooperate with each other to define passages 402, 404. The passage 402 is principally located on one of opposite sides of the first rotary body 354 that is remote from the passage 400, and has an end portion connected to the passage 400. The passage 402 constitutes a part of an annular passage having a center lying on the rotary axis of the first rotary body 354. The passage 404 is connected to the other end portion of the passage 402, and is inclined toward the second guide passage 342. The first and second holding bodies 353, 355 have respective part-cylindrical surfaces serving as passage defining surfaces that cooperate with each to define the passage 402. The passage defining surface of the first holding body 353 functions as a guide passage for guiding the movement of the holding member 304.

A portion of the holding member 304 or the strip body 310 from which the connecting members 302 are not yet separated is disposed in the first guide passage 340, with the attitude of each connecting member 302 causing the caulking claws 46 to face downward. Each connecting member 302 passes through the passage 400, and the holding member 304 is guided toward the first rotary body 354 while being supported at its lower surface by an upper surface of the first holding body 353. In the present description, up and down directions correspond to up and down directions as seen in an attitude of the component-holding-tape connecting apparatus 300 when the apparatus 300 is operated to perform the operation to connect the component holding tapes 10. In this sense, the first operating lever 330 is located upwardly of the second operating lever 332. The strip body 310 is introduced into the passage 400 provided in the first holding body 353, via an opening provided in the attachment portion 350, and then introduced into the passage 402 from the passage 400. In this instance, the feed holes 308 which are located in each of widthwise opposite end portions of the strip body 310 are brought into engagement with the feed protrusions 368 of the pair of rotary engaging members 356, 358, so that the strip body 310 is wound on a part of the circumference of the first rotary body 354 and then introduced into the passage 404. After being introduced into the passage 404, the strip body 310 is introduced into the second guide passage 342 via another opening provided in the attachment portion 350. As the first rotary body 354 is rotated, the holding member 304 or the strip body 310 is fed in the longitudinal direction, whereby the connecting members 302 are fed in the longitudinal direction of the component-holding-tape connecting apparatus 300, with each connecting member 302 having an attitude causing its longitudinal direction being held in parallel to the width direction of the apparatus 300. In the present embodiment, with one rotational motion of the first rotary body 354, the holding member 304 or the strip body 310 is fed by a distance equal to the spacing pitch by which the connecting members 302 are held by the holding member 304. In the present embodiment, an amount of one rotational motion of the first rotary body 354 corresponds to a constant angle equal to an angular interval by which the plurality of feed protrusions 368 are provided in the rotary engaging members 356, 358.

The first holding body 353 is provided with a cutting-off tool 410 for cutting the connecting members 302 off from the holding member 304. The cutting-off tool 410 is positioned in a position between the passages 400, 402, which position is located on an upstream side of the first rotary body 354 as viewed in a connecting-member feed direction, i.e., a feed direction of the portion of the holding member 304 or the strip body 310 from which the connecting members 302 are not yet separated. In the first guide passage 340 and passage 400, the portion of the holding member 304 from which the connecting members 302 are not yet separated is guided toward the first rotary body 354. In the passages 402, 404 and the second guide passage 342, the portion of the holding member 304 from which the connecting members 302 have been separated is guided from a vicinity of the first rotary body 354 toward a position distant from the first rotary body 354. The feed direction of the holding member 304 is inverted in the first rotary body 354, so that the portion of the holding member 304 or strip body 310 from which the connecting members 302 are not yet separated and the portion of the holding member 304 or strip body 310 from which the connecting members 302 have been separated are arranged to be superposed on each other within the second operating lever 332 in the thickness direction. Owing to this arrangement in which the strip-shaped holding member 304 is accommodated within the second operating lever 332, it is possible to substantially avoid the holding member 304 from interfering with the operation of the connection of the component holding tapes 10, and also to permit the component-holding-tape connecting apparatus 300 guiding the holding member 304, to be made compact in size. The second member 336 includes a guide portion 412 that is provided in an opening end portion of the first guide passage 340 which potion is located on the side of the passage 400. The third member 338 includes a guide portion 414 that is provided in an opening end portion of the second guide passage 342 which portion is located on the side of the passage 404. The guide portions 412, 414 serve to guide movement of the holding member 304 between the first guide passage 340 and the passage 400 and between the second guide passage 342 and the passage 404. The guide portion 412 has two parts provided to be separated from each other in a width direction of the first guide passage 340, so that the holding member 304 can be supported at the widthwise opposite end portions which are spaced apart from the connecting members 302, by the two parts of the guide portion 412 located below the holding member 304.

The cutting-off tool 410 will be described.

Described specifically, the cutting-off tool 410 is disposed in a position corresponding to the connecting member 302 which is positioned in the passage 400 to be adjacent to and located on an upstream side of the feed protrusions 368 which protrude upward from the respective rotary engaging members 356, 358 when the first rotary body 354 is positioned in each of the above-described angular positions by the angular-position positioning device 380. The cutting-off tool 410 is arranged to be opposed to a portion of the holding member 304 or the strip body 310 which is not yet wound on the first rotary body 354 and which still extends straight. Each time the first rotary body 354 is positioned in a next one of the angular positions by the angular-position positioning device 380 as a result of the rotational motion of the first rotary body 354, a next one of the connecting members 302 is positioned in a cutting-off position aligned with the cutting-off tool 410. In the present embodiment, the cutting-off position corresponds to the above-described predetermined position.

Figure 13:
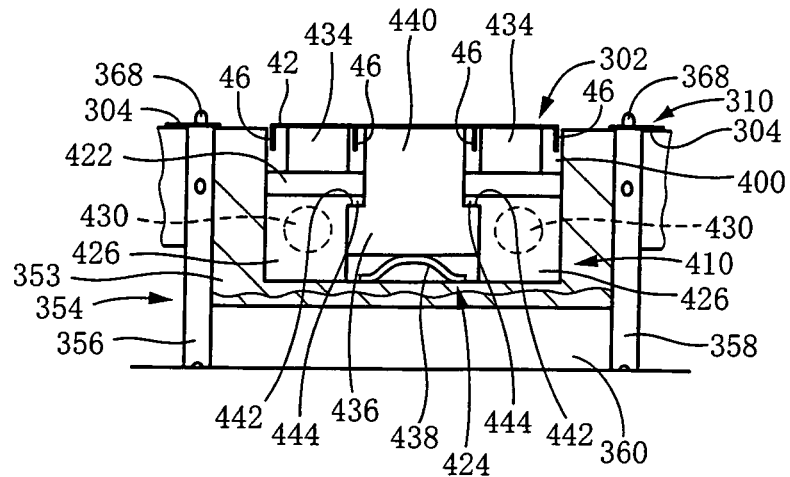
[FIG. 13] A side view (partially in cross section) showing a cutting-off tool of the component-holding-tape connecting apparatus shown in FIG. 11.
Figure 14:
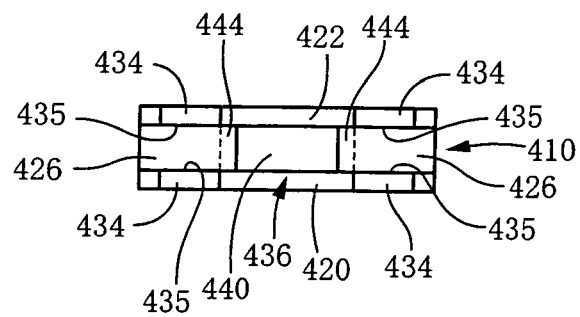
[FIG. 14] A plan view showing the cutting-off tool.
Figure 15:
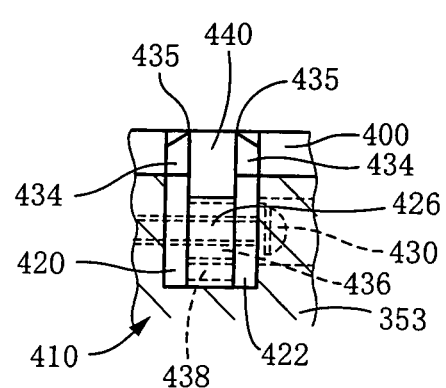
[FIG. 15] A front view (partially in cross section) showing the cutting-off tool.

The cutting-off tool 410 includes a pair of cutting-off members 420, 422 and a metallic-connecting-member pushing device 424, as shown in FIGS. 13-15. In the present embodiment, the cutting-off members 420, 422 are provided by respective plate members each having surfaces held in parallel to the longitudinal direction of each connecting member 302 held by the holding member 304. A pair of spacers 426 are interposed between the cutting-off members 420, 422, as shown in FIGS. 13 and 14, such that the cutting-off members 420, 422 are spaced apart from each other by a distance that is equal to the width of each connecting member 302. The cutting-off members 420, 422 and the spacer 426 are fixed to the first holding body 353 by suitable fixing means such as bolts 430. Each of the cutting-off members 420, 422 has a plurality of (in the present embodiment, two) cutter portions 434. Each of the two cutter portions 434 is positioned in a position corresponding to a portion between two pairs of the caulking claws 46 that are located in a corresponding one of longitudinally opposite side portions of the connecting member 302, and protrudes in the passage 400. A protruding distal end of each of the two cutter portions 434 is opposed to a corresponding one of the bridging portions 306 bridging the holding member 304 and the connecting member 302 that is positioned in the cutting-off position, with a small clearance between the protruding distal end portion and the corresponding bridging portion 306 as measured in the vertical direction. Therefore, each connecting member 302 is supplied to the cutting-off position, without the downwardly projecting caulking claws 46 interfering with the pair of cutter portions 434, such that each of the bridging portions 306 (bridging the holding member 304 and a portion of the connecting member 302 between two pairs of the caulking claws 46 that are located in the corresponding longitudinal side portion) is positioned above the corresponding cutter portion 434. A cutting blade 435 is provided in one of edges of the protruding distal end of each of the two cutter portions 434 extending in parallel to the longitudinal direction of the connecting member 302, which one is located inside the other of the edges (located on the side of the spacer 426).

The connecting-member pushing device 424 includes a pushing member 436 and a plate spring 438 as an elastic member as a kind of biaser. The pushing member 436 has the same width as each connecting member 302, and includes a pushing portion 440 having a size corresponding to a longitudinally central portion of the connecting member 302, i.e., a portion of the connecting member 302 located between central two pairs of the caulking claws 46. The pushing member 436 is vertically movably fitted in a space defined between the pair of cutting-off members 420, 422 and between the two spacers 426, while being biased by the plate spring 438 in a direction causing the pushing portion 440 to protrude in the passage 400. A movement of the pushing member 436 by the biasing of the plate spring 438 is limited by contacts of shoulder surfaces 442 of the pushing member 436 with respective stoppers 444 provided to project from the respective spacers 426. When the pushing member 436 is positioned in its upper end position, an upper surface of the pushing portion 440 is positioned to be opposed to the main body portion 42 of the connecting member 302 that is positioned in the cutting-off position, with a small clearance therebetween. The pushing portion 440 is located in a position corresponding to the portion of the connecting member 302 located between the central two pairs of the caulking claws 46, so that the connecting member 302 can be fed to the cutting-off position, without the pushing portion 440 interfering with the caulking claws 46.

An upper surface of the above-described second holding body 355 constitutes a tape receiving surface 460 having a portion in which a caulking tool 470 is provided, as shown in FIG. 12. The caulking tool 470 is located on one of opposite sides of the first rotary body 354 that is remote from the cutting-off tool 410, and has a plurality of (in the present embodiment, four) presser surfaces 472 which are provided in the tape receiving surface 460 and arranged in a row in a direction parallel to the longitudinal direction of each connecting member 302 held by the holding member 304. The four presser surfaces 472 are inclined with respect to the tape receiving surface 460, and consist of two pairs of the presser surfaces 472 which are located in respective opposite side portions of the caulking tool 470. The caulking tool 470 has two recessed portions 474 each of which is provided between a corresponding one of the two pairs of the presser surfaces 472. The two recessed portions 474 are spaced apart from each other by a distance which is an integer number of times as large as the pitch of the feed holes 32 of the component holding tape 10 and is equal to a distance between the opposite-side two of the three positioning holes 44.

Further, on the tape receiving surface 460, as shown in FIG. 12, there are tape positioning protrusions 494, 496 that are provided to be located on respective opposite sides of the caulking tool 470 as viewed in a direction in which the plurality of presser surfaces 472 are arranged. The tape receiving surface 460 (including the caulking tool 470) is located to be slightly lower than the cutting blades 435 of the respective cutting-off members 420, 422, and the tape receiving surface 460 and the presser surfaces 472 are located to be slightly lower than the upper surface of the first holding body 353 and positioned to be lower than the cutting blades 435. The tape positioning protrusions 494, 496 have tapered guide portions 502, 504 provided by respective distal end portions, and are arranged with the recessed portions 474 in a straight line. The tape positioning protrusions 494, 496 are provided to project from the tape receiving surface 460, and are spaced apart from each other by a distance that is an integer number of times as large as the spacing pitch of the feed holes 32 of the component holding tape 10. Further, each of the tape positioning protrusions 494, 496 is positioned in a position spaced apart from a corresponding one of the recessed portions 474 by a distance that is an integer number of times as large as the spacing pitch of the feed holes 32 of the component holding tape 10. The second holding body 355 serves as a caulking-tool holding body and as a tape-positioner holding body.

On the above-described first holding body 353, there are tape presser members 498, 500 that are provided in respective portions corresponding to portions of the second holding body 355 in which the tape positioning protrusions 494, 496 are provided. The first holding body 353 serves as a cutting-off-tool holding body, as a tape-presser-member holding body and as a first-rotary-body holding body. Since the tape presser members 498, 500 have substantially the same construction as the above-described tape presser members 100, 102, the same reference signs will be used to denote elements providing the same effects as elements described in the above-described embodiment, and description of these elements will not be provided. The tape presser members 498, 500 are movably disposed on the first holding body 353, and their movements are guided by the elongated holes 114, bolts 116 and guide walls 506, 508 as guide members disposed on the first holding body 353 (see FIG. 11). In the present embodiment, as shown in FIG. 11, the pressing portion 104 of each of the tape presser members 498, 500 is so long that its distal end portion (providing the guide portion 108) can extend from a corresponding one of the tape positioning protrusions 494, 496 by a long distance. The tape reviving surface 460 is located to be lower than the upper surface of the first holding body 353. The pressing portion 104 and the tape receiving surface 460 cooperate to define therebetween a small clearance that is smaller than the thickness of the component holding tape 10.

To the second operating lever 332, a moving device 520 is attached through a holding lever 521 as a holding member, as shown in FIG. 11. The holding lever 521 is provided by an elongated-shaped plate member, and is fixed at one of its longitudinally opposite end portions to one of opposite end portions of the first member 334 (constituting the second operating lever 332) which one is remote from the attachment portion 350. Further, the holding lever 521 is bent in a direction causing the other longitudinal end portion of the holding lever 184 to be separated from the second operating lever 70. The other end portion of the holding lever 521 extends toward the cutting-off tool 410 and the caulking tool 470. The moving device 520 is disposed on one of opposite surfaces of the other end portion of the holding lever 521, which one is opposed to the cutting-off tool 410 and the caulking tool 470.

The moving device 520 includes a second rotary body 522. In the present embodiment, the second rotary body 522 is provided by a block-like member having a square shape in its transversal cross section, and is held by a support shaft 524, rotatably about a rotary axis which is perpendicular to the holding surface of the holding lever 521 holding the second rotary body 522 and which is other than the rotary axis of the first rotary body 354. The second rotary body 522 has metallic-connecting-member holding portion 526, 528 provided by protrusion portions extending along its mutually parallel two sides and having an elongated rectangular shape in its transverse cross section. The connecting-member holding portion 526, 528 are spaced apart from each other by a distance equal to a distance between the cutting-off tool 410 and the caulking tool 470. That is, widthwise centers of the respective connecting-member holding portion 526, 528 are distant from each other by a distance equal to a distance between a line passing through centers of the respective recessed portions 474 and a center of each positioning hole 44 of the connecting member 302 positioned in the cutting-off position. Each of the connecting-member holding portion 526, 528 has a width equal to the width of each connecting member 302, and a length slightly larger than the length of each connecting member 302. Each of the connecting-member holding portions 526, 528 has a metallic-connecting-member receiving surface 530 provided by its protruding end surface. The connecting-member receiving surface 530 has a pair of cutting blades 532 provided by respective edges thereof parallel to the longitudinal direction of the receiving surface 530. In the present embodiment, a part of each of the connecting-member holding portions 526, 528 cooperates with the cutting-off tool 410 to constitute the cutting-off device 326. Further, in the present embodiment, the connecting-member holding portion 526, 528 are provided with respective permanent magnet members 536, 538 which constitutes the respective receiving surfaces 530.

A plurality of (in the present embodiment, two) metallic-connecting-member positioning protrusions 540 are provided to protrude from each of the connecting-member receiving surfaces 530, so as to be spaced apart from each other by a distance in the longitudinal direction of the connecting-member holding portions 526, 528. The two connecting-member positioning protrusions 540 are spaced apart from each other by a distance that is equal to a distance between two of the three positioning holes 44 of each connecting member 302 which two are located in longitudinally opposite end portions of the connecting member 302. Each of the connecting-member positioning protrusions 540 has a tapered guide portion 542 provided by its distal end portion.

The second rotary body 522 is positioned relative to the holding lever 521 by a positioning device 544. In the present embodiment, the positioning device 544 includes an engaging portion in the form of a ball plunger 546 provided in the second rotary body 522, and an engaged portion in the form of a plurality of (in the present embodiment, two) recessed portions 548 provided in the holding lever 521. Since the ball plunger 546 has substantially the same construction as the above-described ball plunger 382, detailed description thereof will not be provided. The two recessed portions 548 are provided in the holding lever 521 to be located on a circle whose center corresponds to the rotary axis of the second rotary body 522 and equi-angularly spaced apart from each other (positioned in respective positions distant from each other by 180°). The second rotary body 522 can be positioned by the positioning device 544, in a selected one of two positions. With the second rotary body 522 being positioned in either of the two positions, the longitudinal direction of the two connecting-member holding portions 526, 528 are held in parallel to the width direction of the component-holding-tape connecting apparatus 300 and the longitudinal direction of each connecting member 302 held by the holding member 304. When the second rotary body 522 is positioned in one of the two positions, one of the connecting-member holding portions 526, 528 is positioned in the cutting-off position so as to cooperate with the cutting-off tool 410 for cutting the connecting member 302 off from the holding member 304, while the other of the connecting-member holding portions 526, 528 is positioned in the caulking position so as to cooperate with the caulking tool 470 for clinching the caulking claws 46 of the connecting member 302. When the second rotary body 522 is positioned in the other of the two positions, the one of the connecting-member holding portions 526, 528 is positioned in the caulking position while the other of the connecting-member holding portions 526, 528 is positioned in the cutting-off position. In the present embodiment, the connecting-member holding portions 526, 528 cooperate with the above-described tape receiving surface 460, tape positioning protrusions 494, 496 and tape presser members 498, 500 to constitute the holding device 322.

The first operating lever 330 is attached to the second operating lever 332 through a pair of brackets 570 and a shaft 572, pivotably about an axis parallel to the width direction of the component-holding-tape connecting apparatus 300. The first operating lever 330 is pivotably fitted, at a tubular fitting portion 574, on the shaft 572. An engaging portion 576 is provided on the side of the holding lever 521, and has an engaging surface 578 that is linearly inclined such that a distance of the engaging surface 578 from the first operating lever 330 is increased as viewed in a direction away from the pivot axis of the first operating lever 330 toward a free end portion of the first operating lever 330.

There will be described an operation performed by the component-holding-tape connecting apparatus 300, to connect two component holding tapes 10.

Figure 18:
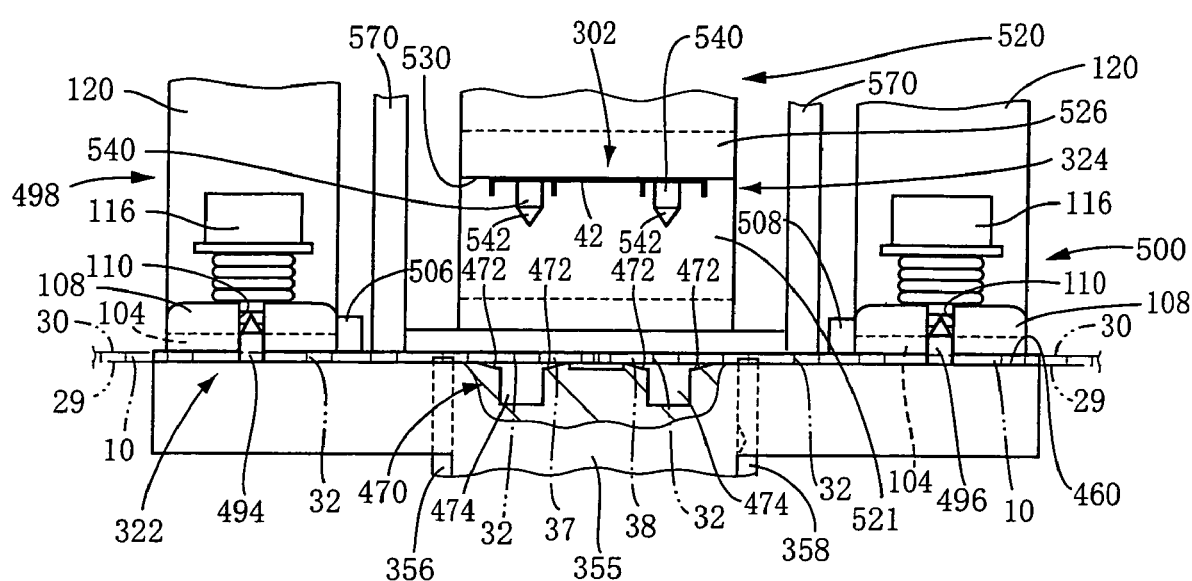
[FIG. 18] A view explaining connection of component holding tapes of paper-tape type in the component-holding-tape connecting apparatus shown in FIG. 11.

During the connecting operation, the two component holding tapes 10 are held by the holding device 322, and pressed by the tape presser members 498, 500. One of the two tape presser members 498, 500, e.g., the tape presser member 498 is retracted to its retracted position, and then one of the two component holding tapes 10, e.g., the tape 10 currently supplying the components 12 is brought into engagement at its trailing end portion 37 with the tape positioning protrusion 494, as shown in FIG. 18. That is, the tape positioning protrusion 494 is fitted into the feed hole 32 of the trailing end portion 37 of the currently supplying tape 10, while the top surface 29 of the tape 10 is being held to face the tape receiving surface 460. In this instance, the tape 10 is set while the tape positioning protrusion 494 is held in engagement with the feed hole 32 such that the trailing-end, complete feed hole 32 is positioned in a position corresponding to the recessed portion 474, and then the tape presser member 498 is moved to its pressing position so as to press the tape 10. Similarly, the other of the two component holding tapes 10, e.g., the tape 10 next supplying the components 12 is brought into engagement at its leading end portion 38 with the tape positioning protrusion 496. That is, the tape positioning protrusion 496 is fitted into the feed hole 32 of the leading end portion 38 of the next supplying tape 10, while the surface 29 of the tape 10 is being held to face the tape receiving surface 460, such that the leading-end, complete feed hole 32 is positioned in a position corresponding to the recessed portion 474, and then the tape presser member 500 is caused to press the tape 10. Each of the two component holding tapes 10 is held at its entirety in the width direction by a corresponding one of the tape presser members 498, 500, as shown in FIG. 11.

In a state in which the two component holding tapes 10 are set on the component-holding-tape connecting apparatus 300, the feed holes 32 of the two tapes 10 are arranged at a constant spacing pitch, and the almost half feed holes 32 which are formed in the trailing and leading ends of the respective two tapes 10 are positioned on a portion of the caulking tool 470 between the two recessed portions 474, i.e., the central portion of the caulking tool 470, and are opposed to each other. The trailing and leading end portions 37, 38 of the two tapes 10 are thus positioned and held in the caulking position, i.e., in a position corresponding to the connecting member 302 which is held by the connecting-member holding portion and which is positioned in the caulking position. The two tapes 10 intersects with the longitudinal direction of the component-holding-tape connecting apparatus 300, and is held perpendicular to the longitudinal direction of the apparatus 300. The portions of the respective tapes 10 in which the feed holes 32 are provided, are gripped from one of opposite sides of the tapes 10 in a width direction that is a direction perpendicular to the longitudinal direction of the tapes 10. It can be also considered that the tape receiving surfaces constituted by the upper surface of the second holding body 355 are provided on the opposite sides of the caulking tool 470 and that the tape positioning protrusions 494, 496 are provided on the respective tape receiving surfaces.

A leading one of the connecting members 302 held by the holding member 304 is positioned in the cutting-off position. In the second rotary body 522, one of the two connecting-member holding portions 526, 528 holds the connecting member 302, while the other does not holds the connecting member 302. The connecting-member holding portion holding the connecting member 302, e.g., the connecting-member holding portion 526 holding the connecting member 302 is positioned in an angular position corresponding to the caulking position. Meanwhile, the connecting-member holding portion 528 not holding the connecting member 302 is positioned in an angular position corresponding to the cutting-off position.

The first and second operating levers 330, 332 are gripped by the operator, and are pivoted by the operator in directions causing the levers 330, 332 to be relatively moved toward each other. Thus, the holding lever 521 is pressed by the engaging portion 576 of the first operating lever 330, whereby the second rotary body 522 is pivoted in a direction toward the holding portion 352, so that the connecting-member holding portions 526, 528 are caused to approach the caulking tool 470 and the cutting-off tool 410, respectively, for performing the caulking and cutting-off operations.

The two connecting-member positioning protrusions 540 of the connecting-member holding portion 528 not holding the connecting member 302 are fitted into the positioning holes 44 of the connecting member 302 that is positioned in the cutting-off position. Meanwhile, the connecting-member receiving surface 530 is brought into contact with the connecting member 302, and the connecting-member holding portion 528 are fitted into the space between the cutting-off members 420, 422, so that the cutting blades 532 cooperate with the cutting blades 435 to cut portions of the respective bridging portions 306, which portions are close to the connecting member 302, for thereby cutting the connecting member 302 off form the holding member 304. In this instance, the bridging portions 306 are cut, while the receiving member 436 is being pressed by the connecting-member holding portion 528 down against the biasing force of the plate spring 438. Since the connecting-member receiving surface 530 is constituted by a magnet, the connecting member 302 is attracted by the connecting-member receiving surface 530 when being cut off from the holding member 304. That is, the connecting member 302 is held by the connecting-member holding portion 528, while being positioned by the pair of connecting-member positioning protrusions 540.

Concurrently with the separation of the connecting member 302, the caulking claws 46 of the connecting member 302 are bent by the caulking device 324. During movement of the connecting member 302 held by the connecting-member holding portion 526 toward the two component holding tapes 10 as a result of the pivot motion of the holding lever 521, one of the two connecting-member positioning protrusions 540 is fitted into the complete feed hole 32 of the trailing end portion 37 of one of the two component holding tapes 10, while the other of the two connecting-member positioning protrusions 540 is fitted into the complete feed hole 32 of the leading end portion 38 of the other of the two tapes 10, whereby each of the two tapes 10 is held at two portions thereof by a corresponding one of the tape positioning protrusions 494, 496 and a corresponding one of the connecting-member positioning protrusions 540. Thus, the trailing and leading end portions 37, 38 of the two tapes 10 are held in parallel to the longitudinal direction of the connecting member 302. Even if the feed holes 32 are slightly misaligned with the respective connecting-member positioning protrusions 540, each positioning protrusion 540 is guided by its guide portion 542 to be fitted into the corresponding feed hole 32. Since the connecting-member positioning protrusions 540 are received in the respective recessed portions 474, the access of the connecting-member holding portion 526 to the tapes 10 is allowed.

When the connecting-member holding portion 526 comes to be further close to the component holding tapes 10, the caulking claws 46 of the connecting member 302 held by the connecting-member holding portion 526 are caused to pierce through the carrier tapes 20 of the component holding tapes 10 from the side of the bottom surfaces 30, and to protrude onto the side of the top surfaces 29 so as to be brought into contact with the respective presser surfaces 472. With further movement of the connecting-member holding portion 526, the main body portion 42 of the connecting member 302 is brought into close contact with the bottom surface 30 of the carrier tape 20, while the caulking claws 46 are pressed by and between the connecting-member receiving surface 530 and the presser surfaces 472 so as to be deformed to be clinched, whereby the trailing and leading end portions 37, 38 of the two component holding tapes 10 are connected to each other. Each of the trailing and leading end portions 37, 38 of the respective tapes 10 is pierced by four caulking claws 46 that are clinched on the top surfaces 29 of the tapes 10. In the present embodiment, each of the connecting-member holding portions 526, 528 constitutes a caulking tool, and cooperates with the above-described caulking tool 470 to constitute the caulking device 324 that is operated by the second operating lever 332 in cooperation with the first operating lever 330.

The first operating lever 330 is operated by the operator to be pivoted until the bending of the caulking claws 46 is completed. The second rotary body 522 is held by the holding lever 521, such that each of the caulking claws 46 is pressed evenly in the width direction of the connecting member 302 without inclination of the connecting-member receiving surface 530 with respect to the presser surfaces 472 about the pivot axis of the holding lever 521 in a state in which the caulking claws 46 are completely clinched by the caulking tool 470. Due to difference with respect to the distance from the pivot axis of the holding lever 521, a point of time at which the cutting-off operation is made by the cooperation of the connecting-member holding portion 528 and the cutting-off tool 410 does not coincide with a point of time at which the caulking operation is made by the cooperation of the connecting-member holding portion 526 and the presser surfaces 472, and the cutting-off operation is initiated before initiation of the caulking operation. However, the caulking can be satisfactorily done although the caulking operation is initiated after initiation of the cutting-off operation, because the cutting-off operation is made by introducing the connecting-member holding portion 528 into the space between the pair of cutting-off members 420, 422, and is continued until the cutting blades 532 of the connecting-member holding portion 528 come to be lower that the cutting blades 435 of the respective cutting-off members 420, 422 by a small distance. Further, since the presser surfaces 472 are located to be slightly lower than the cutting blades 435 of the respective cutting-off members 420, 422, the caulking operation is completed precisely when the cutting-off operation is completed. The engaging surface 578 has an inclination angle and a length which are sufficient for the first operating lever 330 to cause the holding lever 521 to be pivoted by an angle sufficient for causing the caulking tool 470 to caulk the connecting member 302, and sufficient for the first operating lever 330 to obtain an operating stroke causing the holding lever 521 to be pivoted by an angle sufficient for the caulking of the connecting member 302. A operating force applied to the first operating lever 330 is boosted, as in the above-described embodiment, whereby the claws 46 are sufficiently clinched. It can be considered that the engaging portion 576 constitutes a cam and that the engaging surface 578 constitutes a cam surface.

When the connecting member 302 has been cut off from the holding member 304 and the caulking claws 46 have been clinched, the force applied to the first operating lever 330 is released by the operator whereby the first operating lever 330 and the moving device 520 are returned to the respective positions shown in FIG. 11. In this instance, the connecting member 302 cut off from the holding member 304 is held by the connecting-member holding portion 528, and is moved together with the holding portion 528 so as to be separated from the holding member 304. The connecting member 302 is pushed up by the pushing member 436, and is reliably held by the connecting-member holding portion 528 so as to be removed from the holding member 304. Meanwhile, the connecting-member positioning protrusions 540 of the connecting-member holding portion 526 are removed from the positioning holes 44 of the connecting member 302, whereby the two component holding tapes 10 connected through the connecting member 302 can be removed from the component-holding-tape connecting apparatus 300. The connecting member 302 connects the two component holding tapes 10 that are pressed by the tape presser members 498, 500, and is removed from the connecting-member holding portion 526 against the magnetic force of the magnet member 536.

Figure 19:
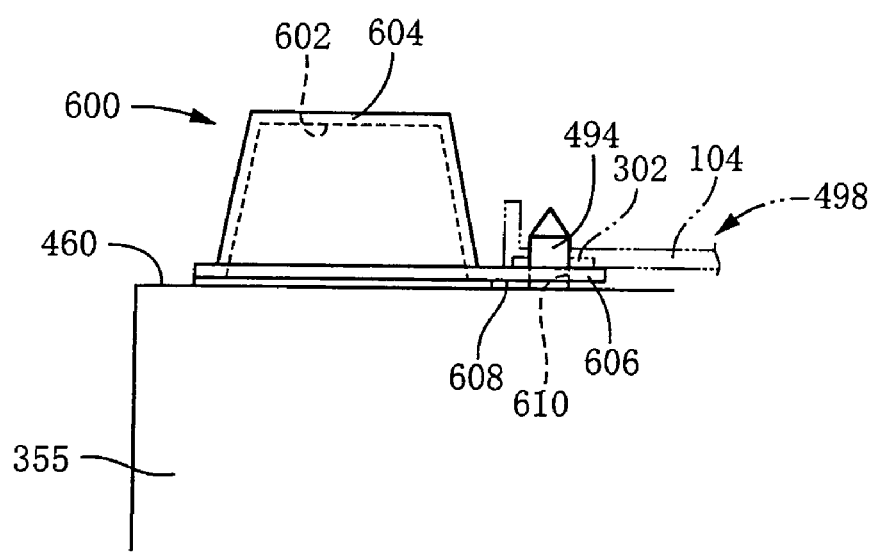
[FIG. 19] A view explaining connection of component holding tapes of emboss type in the component-holding-tape connecting apparatus shown in FIG. 11.

In preparation or initiation of the next connecting operation, the operator rotates the second rotary 522 by 180° whereby the connecting-member holding portion 528 holding the connecting member 302 is positioned in the caulking position, for thereby moving the connecting member 302 to the caulking position, while the connecting-member holding portion 526 not holding the connecting member 302 is positioned in the cutting-off position. In the present embodiment, the moving device 520 cooperates with the first rotary body 354 that supplies the connecting member 302 to the cutting-off position by feeding the holding member 304 or the strip body 310, to constitute the supplying device 320. The operator operates the operating portion 376 to impart one rotational motion to the first rotary body 354, so as to feed the strip body 310 for thereby moving a leading one of the connecting members 302 held by the holding member 304, to the cutting-off position. Since the first rotary body 522 is positioned by the angular-position positioning device 380 in a selected one of the plurality of angular positions, the first rotary body 522 can be operated by the operator with an excellent controllability whereby the connecting member 302 can be accurately positioned in the cutting-off position.

Where the component-holding-tape connecting apparatus 300 is used to connect component holding tapes 600 of emboss type each having emboss portions 604 defining therein a component storing recess 602, the component holding tape 600 is set on the tape receiving surface 460, such that the emboss portions 604 faces upward while a surface 608 of a carrier tape 606 faces downward, and such that the tape positioning protrusions 494 are fitted in respective feed holes 610, as schematically shown in FIG. 19. The tape presser members 498, 500 are arranged to press only a portion of the carrier tape 606 in which the feed holes 610 are provided. Each of the tape presser members 498, 500 is movable in a direction parallel to the feed direction of the strip body 310, and is positioned in its pressing position for pressing the corresponding component holding tape. Since the pressing position is adjustable within a range allowing movement of the bolt 116 within the elongated hole 114, the pressing position can be changed depending upon whether the component holding tape is of paper-sheet type or emboss type.

Where the component-holding-tape connecting apparatus 300 is used to connect the component holding tapes 10 of paper-sheet type, too, the tape presser members 498, 500 may be arranged to press only a portion of the tape 10 in which the feed holes 32 are provided. Further, the length of the pressing portion 104 of each of the tape presser members 498, 500 may be reduced to press only the portion of the tape provided with the feed holes, as in the above-described component-holding-tape connecting apparatus 60, so that the tape presser members 498, 500 are arranged to press only the portion of the tape provided with the feed holes, irrespective of whether the component holding tape is of paper-sheet type or emboss type.

Further, in the component-holding-tape connecting apparatus 60, too, each tape receiving surface may be arranged to receive thereon the component holding tape in its entirety in the width direction thereof while each tape presser member may be arrange to press the component holding tape in its entirety in the width direction thereof.

In the above-described embodiments, the movement (supply) of the connecting member to the caulking position is made by the operation that is other than the operation of the operating lever. However, the movement of the connecting member to the caulking position may be made in response to the operation of the operating lever. Further, where the connecting members are held by the holding member, the holding member or the strip body may be arranged to be fed in response to the operation of the operating lever, as in an embodiment that will be described below with reference to FIGS. 20-22. It is noted that elements providing the same effects as elements described in the above-described embodiments will be described by using the same reference signs as needed.

A component-holding-tape connecting apparatus 690 of the present embodiment is identical in construction with the component-holding-tape connecting apparatus in the embodiment shown in FIGS. 11-19, except that the feeding of the holding member or the strip body by the rotation of the first rotary body and the movement of the connecting member to the caulking position by the moving device are made, in response to the operation of the first and second operating levers, together with the bending of the caulking claws.

Between a first operating lever 700 corresponding to the above-described first operating lever 330 and a first rotary body 702 corresponding to the above-described first rotary body 354, there is provided a first motion converting device 704. Between the first operating lever 700 and a second rotary body 706 corresponding to the above-described second rotary body 522, there is provided a second motion converting device 708.

The first motion converting device 704 includes a rotary driving device 710 for rotating the first rotary body 702, and a motion transmitting device 712 for transmitting a pivot motion of the first operating lever 700 to the rotary driving device 710.

Figure 22:
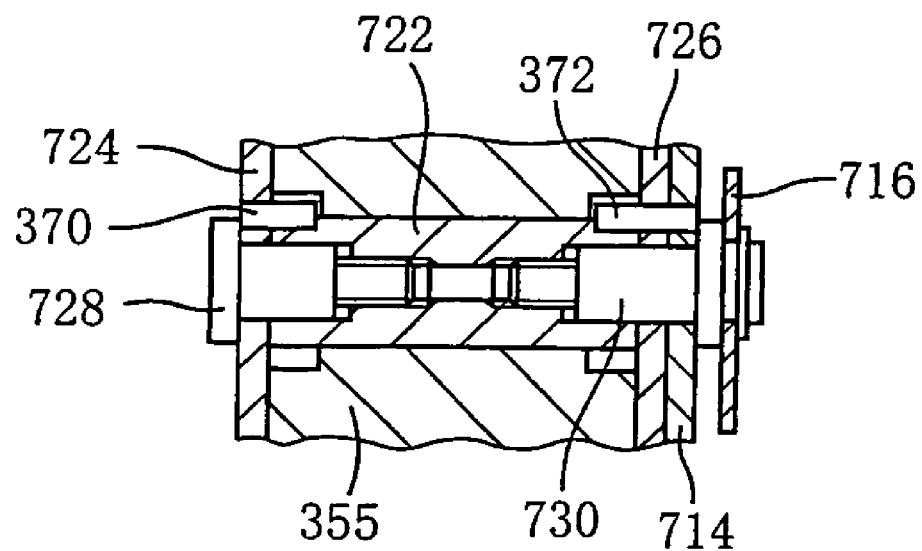
[FIG. 22] A side cross sectional view showing a part of a state in which a rotary engaging member and other members are held by a holding body in the component-holding-tape connecting apparatus shown in FIG. 20.

In the present embodiment, the rotary driving device 710 is of ratchet type, and includes a ratchet wheel 714, a drive lever 716 as a drive member, and a ratchet pawl 718. As shown in FIG. 22, the first rotary body 702 has a rotary shaft 722 to which a pair of rotary engaging members 724, 726 through respective screw members 728, 730. The ratchet wheel 714 is attached together with the rotary engaging member 726 as one of the engaging members 724, 726, to the rotary shaft 722, coaxially with the engaging member 726. The drive lever 716 is attached to an end portion of the screw member 730 that protrudes from the ratchet wheel 714, so as to be pivotable relative to the screw member 730. The ratchet pawl 718 is attached to the drive lever 716, so as to be pivotable about an axis parallel to an axis about which the drive lever 716 is pivotable. The ratchet pawl 718 is biased by a spring 732 serving as an elastic member as a kind of biaser, in a direction causing the ratchet pawl 718 to be held in engagement with tooth of the ratchet wheel 714. A stopper lever 734 is provided in the second holding body 355, and is arranged to be held in engagement with teeth of the ratchet wheel 714, so as to allow rotation of the wheel 714 in a forward direction (in a direction for feeding the connecting members) and inhibit rotation of the wheel 714 in a reverse direction.

Figure 21:
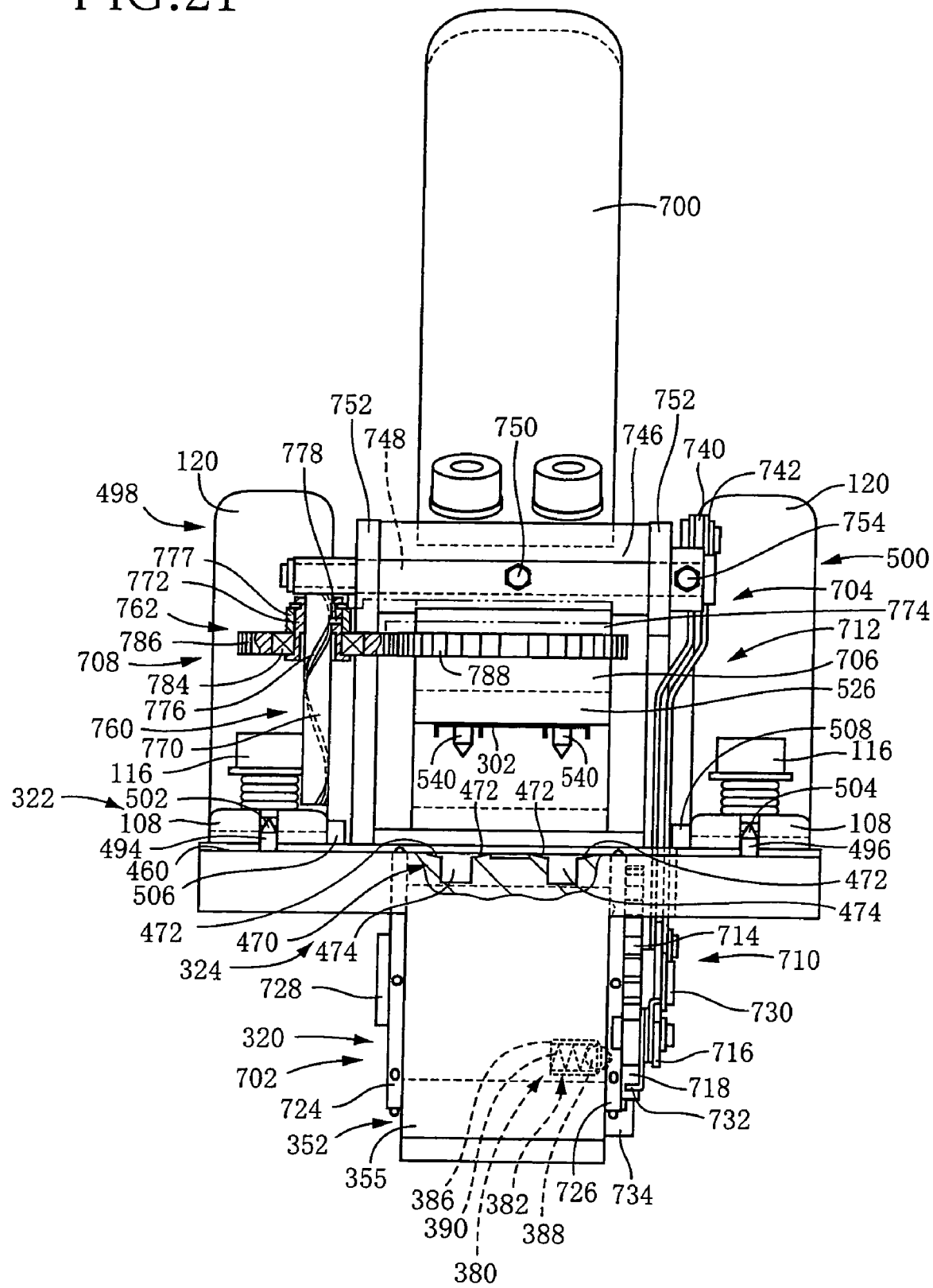
[FIG. 21] A side view (partly in cross section) showing the component-holding-tape connecting apparatus shown in FIG. 20.

The motion transmitting device 712 includes a lever 740 and a link 742. The first operating lever 700 is fitted at its fitting portion 746 on a pivot shaft 748, and is fixed to the pivot shaft 748 through fixing means that includes a set screw 750, for example, so that the pivot shaft 748 is pivoted when the first operating lever 700 is pivoted. The pivot shaft 748 is pivotably supported by a pair of brackets 752, and has an end portion protruding from a corresponding one of the brackets 752. The lever 740 is fixed at its end portion to the protruding end portion of the pivot shaft 748, for example, through fixing means that includes a set screw 754, so that the lever 740 is pivoted by the operation of the first operating lever 700. The link 742 is connected at its end portion to the other end portion of the lever 740, as shown in FIG. 21, so as to be pivotable relative to the lever 740. The link 742 is connected at the other end portion thereof to the above-described drive lever 716, so as to be pivotable relative to the drive lever 716.

There will be described the second motion converting device 708. In the present embodiment, as shown in FIG. 21, the second motion converting device 708 includes a pivot motion converting device 760 for converting the pivot motion of the first operating lever 700 into a rotary motion about an axis parallel to an axis about which the second rotary body 706 is rotatable, and a rotary motion transmitting device 762 for transmitting the rotary motion to the second rotary body 706. The pivot motion converting device 760 includes a driving member 770 provided by a shaft and held by the pivot shaft 748 of the first operating lever 700, and a driven member 772 fitted on the driving member 770.

The pivot shaft 748 has the other end portion that is opposite to the above-described end portion to which the lever 740 is fixed. To the other end portion of the pivot shaft 748 protruding from the corresponding bracket 752, the driving member 770 is attached pivotably relative to the pivot shaft 748. The driving member 770 provided by the shaft having a circular shape in its transverse cross section, and is curved to define a part of an arc whose center corresponds to a pivot axis of a holding lever 774 which holds the second rotary body 706 and which corresponds to the above-described holding lever.

The driving member 770 has a driving portion in the form of a groove 776 provided in its outer circumferential surface.

The driven member 772 is provided by a cylindrical member, and is held by the holding lever 774 so as to be pivotable about an axis parallel to a rotary axis of the second rotary body 706. The driven member 772 is fitted on the driving member 770 with a clearance therebetween allowing the curve of the driving member 770. The holding lever 774 has a holding portion 777 provided by its feed end portion. The holding portion 777 extends forwardly of the brackets 752, and bypasses the corresponding bracket 752 to extend onto one of opposite sides of the corresponding bracket 752 in which the driving member 770 is located. The driven member 772 is rotatably held by the holding portion 777 whose part is indicated by two-dot chain line in FIG. 21. A protrusion portion 778 as driven portion protrudes from an inner circumferential surface of the driven member 772 towards a center of the driven member 772, and is fitted in the groove 776. The groove 776 is inclined with respect to an axis of the driving member 770, and extends in a helical direction of the driving member 770. When the first operating lever 700 is operated to pivot the holding lever 774 causing movement of the driven member 772 together with the holding lever 774, the protrusion portion 778 is moved in the helical groove 776, so that the driven member 772 is rotated owing to the inclination of the helical groove 776 with respect to the axis of the driving member 770.

As shown in FIG. 21, a gear 786 is mounted on the driven member 772 with an one-way clutch 784 interposed therebetween, and is arranged to mesh with a gear 788, which is mounted on the second rotary body 706 so as to be unrotatable relative to the second rotary body 706. The one-way clutch 784 is adapted to not transmit rotation of the driven member 772 to the gear 786, which rotation is caused by the pivot motion of the holding lever 774 when the second rotary body 706 is caused to approach the caulking tool 470 and the cutting-off tool 410 so as to perform the caulking and cutting-off operations. However, the one-way clutch 784 is adapted to transmit rotation of the driven member 772 to the gear 786, which rotation is caused by the pivot motion of the holding lever 774 when the first operating lever 700 is returned to its non-operating position.

Figure 20:
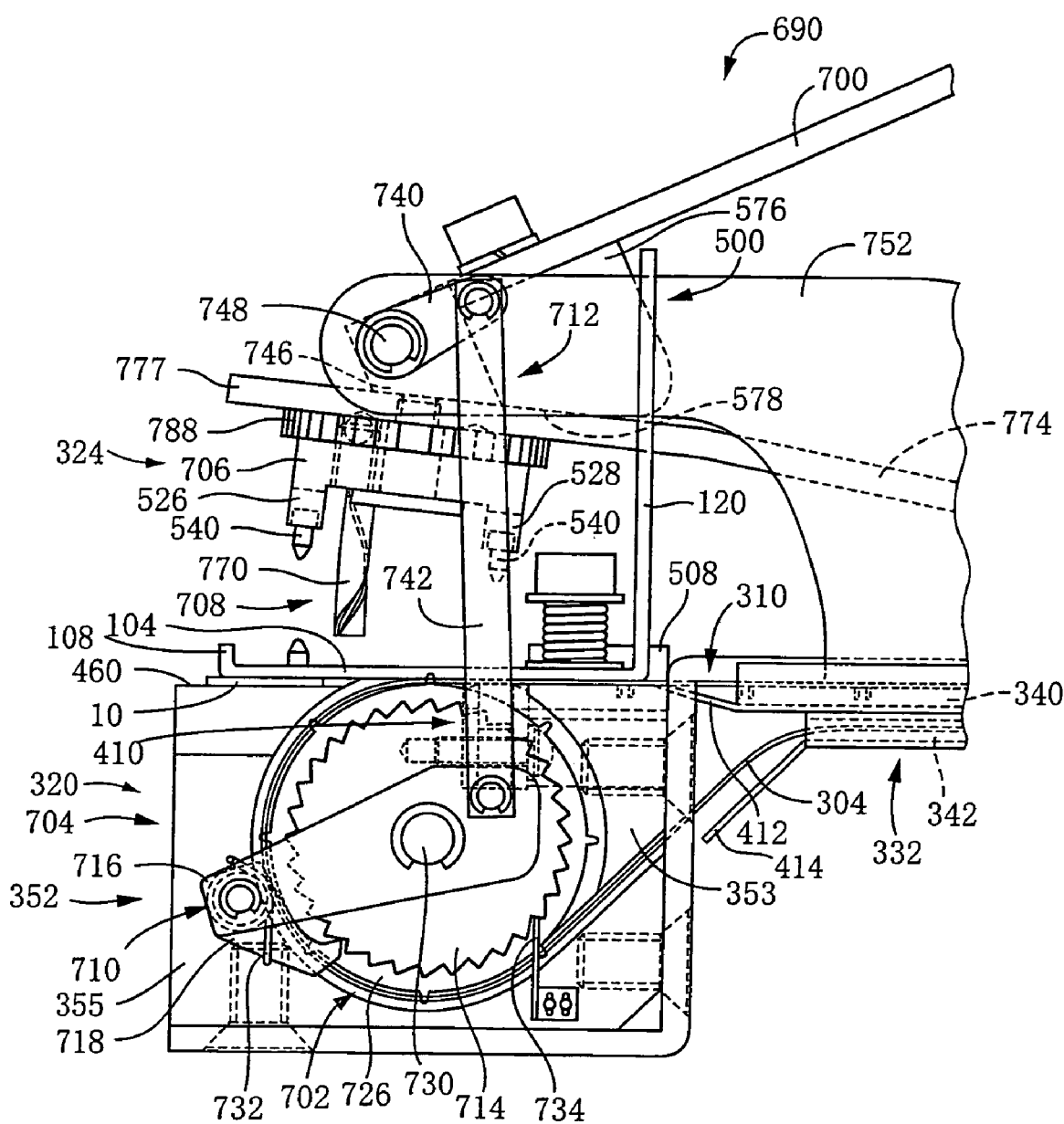
[FIG. 20] A front view showing a major portion of a component-holding-tape connecting apparatus as still another embodiment of the claimable invention.

When the first and second operating levers 700, 702 are operated by the operator to be pivoted toward each other for bending the caulking claws 46 of the connecting member 302, the lever 740 and the link 742 are pivoted while the drive lever 716 is pivoted in the reverse direction (in clockwise direction as seen in FIG. 20). In this instance, the stopper lever 734 inhibits rotation of the ratchet wheel 714, while the ratchet pawl 718 passes over tooth of the ratchet wheel 714 for preparing to feed the connecting members 302 or the holding member 304. That is, during the caulking and cutting-off operations, the first rotary body 702 is not rotated so that the connecting members 302 or the holding member 304 are not fed. Meanwhile, the holding lever 774 is pivoted as a result of the pivot motion of the first operating lever 700, and the second rotary body 706 is caused to approach the caulking tool 470 and the cutting-off tool 410 while the driven member 772 is moved and rotated relative to the driving member 770. As in the component-holding-tape connecting apparatus 300 of the above-described embodiment, the caulking claws 46 are bent while the connecting member 300 is cut off from the holding member 304. In this instance, the rotation of the driven member 772 is not transmitted to the gear 786, so that the second rotary body 706 is not rotated.

Upon completion of the caulking and cutting-off operations, the force applied to the first operating lever 700 is released whereby the first operating lever 700 is pivoted to its non-operating position. The pivot motion of the first operating lever 700 to the non-operating position causes the lever 740 and the link 742 to be pivoted, and causes the drive lever 716 to be pivoted in the forward direction (in counterclockwise direction as seen in FIG. 20). The ratchet pawl 718 is moved by the pivot motion of the drive lever 716, while being held in engagement with tooth of the ratchet wheel 714, thereby causing the ratchet wheel 714 to be rotated in the forward direction. In this instance, the stopper lever 734 allows the forward rotation of the ratchet wheel 714. The rotation of the ratchet wheel 714 imparts one rotational motion to the first rotary body 702. Thus, the first rotary body 702 is rotated by one pitch, whereby the holding member 304 or the strip body 310 is fed by one pitch, so as to move the connecting member 302 to the cutting-off position. That is, the first rotary body 702 is rotated in response to the operation or pivot motion of the first and second operating levers 700, 322, whereby the connecting member 302 is moved to the cutting-off position.

Meanwhile, the driven member 772 is moved and rotated relative to the driving member 770, and the rotation of the driven member 772 is transmitted to the gear 786, thereby causing the gear 786 and the second rotary body 706 to be rotated. The configuration and dimension of the groove 776 and the diameters (gear ratio) of the gears 786, 788 are suitably set such that the second rotary body 706 is rotated by 180° as a result of the pivot motion of the holding lever 774 caused by the pivot motion of the first operating lever 700 from its position of the completion of the caulking and cutting-off operations to its non-operating position. Thus, the second rotary body 706 is automatically rotated by 180° in response to the return of the first and second operating levers 700, 332 after the caulking and cutting-off operations, so that the connecting member 302 separated from the holding member 304 and held by the connecting-member holding portion is moved to the caulking position.

It is noted that, in the embodiment shown in FIGS. 1-10, the operating portion provided for operatively rotating the rotary body 140 may be provided on one of opposite sides of the rotary body 140 that is remote from the shaft 156.

In the embodiment shown in FIGS. 1-10, there may be provided a positioning device for positioning the rotary body 140 in positions each causing a corresponding one of the plurality of connecting-member holding portions 144 to be positioned in the caulking position and causing the connecting member 40 held by the corresponding connecting-member holding portion 144 to be positioned in the caulking position. The positioning device may be constructed, for example, to include a plurality of recessed portions and one ball plunger.

In the embodiment shown in FIGS. 1-10, too, there may be provided a pivot motion converting device for converting the pivot motion of the first operating lever 68 into the rotary motion of the rotary body 140, so that the rotary body 140 is rotated whereby the connecting member 40 is moved to the caulking position, in response to the pivot motion of the first operating lever 68.

Where the plurality of metallic connecting members are held by the holding member, the component-holding-tape connecting apparatus may be provided with a holding device that holds a portion of the strip body from which the connecting members are not yet separated. The holding device is constructed, for example, to include a storage storing the strip body that is folded, or a reel winding the strip body thereon. The holding device serves also as a storing device and a supplying device for storing and supplying the strip body, respectively. The holding device is detachably attached to the second operating lever, for example, so that the strip body is introduced into the first guide passage from the holding device. When no strip body remains in the holding device, for example, the empty reel or empty storage is replaced with new reel having strip body wound thereon and holding the connecting members or with new storage having strip body stored therein and holding the connecting members, whereby the holding device is replenished with the connecting members.

In each of the embodiment shown in FIGS. 11-22, a plurality of tape positioning protrusions may be provided for each component holding tape, so that each of the two component holding tapes is positioned by the plurality of tape positioning protrusions before the connecting-member positioning protrusion is fitted into the feed hole in the caulking operation.

In each of the embodiment shown in FIGS. 11-22, it is not essential that the guide portions are provided for guiding the portion of the holding member 304 from which the connecting members 302 are not yet separated and also the portion of the holding member 304 from which the connecting members 302 have been separated. At least one of the guide portions may be omitted.

In each of the embodiment shown in FIGS. 1-22, the caulking claws 46 may be clinched on the bottom surface 30 of the carrier tape 20. Upon setting of the component holding tape 10 on the component-holding-tape connecting apparatus 60, 300, 690, one of the top and bottom surfaces 29, 30 of the carrier tape 20 may be selected as a surface that is to be received on the tape receiving surface, such that the caulking claws 46 are clinched on a desired one of the top and bottom surfaces 29, 30. Where the caulking claws 46 are clinched on the bottom surface 30 for connecting the component holding tapes of emboss type in the component-holding-tape connecting apparatus 300, 690 of each of the embodiments shown in FIGS. 11-20, for example, the tape receiving surface has a cutout for avoiding interference with the component storing recess that protrudes from the portion of the tape in which the feed holes are provided.

The connecting member may have two positioning holes or four or more positioning holes. Further, the connecting member does not necessarily have to have the positioning holes. That is, the presence of the positioning holes in the connecting member is not essential, for example, in a case where the component holding tape has no feed hole, a case where the component holding tape having the feed holes is to be connected at its portion in which the feed holes are not provided, and a case where the connecting-member holding portion is arranged to position and hold the connecting member by a member other than the connecting-member positioning protrusion.

Further, the component-holding-tape connecting apparatus may be constructed to caulk the connecting member for connecting two component holding tapes while its longitudinal direction is held in parallel to the longitudinal direction of the component holding tapes. To this end, for example, the supplying device is arranged to supply the connecting members to the caulking position while the longitudinal direction of the connecting member is held in parallel to the longitudinal direction of the component-holding-tape connecting apparatus, the holding device is arranged to hold the trailing and leading end portions of the respective two component holding tapes and the connecting member supplied to the caulking position while the longitudinal directions of the component holding tapes and the connecting member are held in parallel to the longitudinal direction of the component-holding-tape connecting apparatus, and the caulking device is arranged to caulk the connecting member supplied to the caulking position as described above.

While the several embodiments of the present claimable invention have been described in detail, for illustrative purpose only, it is to be understood that the present claimable invention may be embodied with various modifications, such as those described above, which may occur to those skilled in the art.

The invention claimed is:

1. A component-holding-tape connecting apparatus for connecting two component holding tapes through a connecting member having a plurality of caulking claws, by caulking end portions of the respective two component holding tapes and the connecting member in a caulking position, with the connecting member being held in close contact with the end portions, and with each of the end portions being pierced by at least one of the plurality of caulking claws of the connecting member, said component-holding-tape connecting apparatus comprising:
    a supplying device holding a plurality of connecting members each provided by the connecting member, and supplying the plurality of connecting members one by one to said caulking position;
    a holding device holding, in said caulking position, the end portions of the respective two component holding tapes and the connecting member which is supplied by said supplying device; and
    a caulking device caulking the end portions of the respective two component holding tapes and the connecting member which are held by said holding device, by causing at least one of the plurality of caulking claws of the connecting member to pierce through each of the end portions of the respective two component holding tapes, and deforming the at least one of the plurality of caulking claws of the connecting member,
    wherein said supplying device includes a rotary body positioning the plurality of connecting members one by one in a predetermined position, and
    wherein said rotary body is rotated about a rotary axis thereof by a predetermined angle when operated to position each one of the plurality of connecting members in said predetermined position.

2. The component-holding-tape connecting apparatus according to claim 1, further comprising an operating lever and a motion converting device,
    wherein said caulking device is operated by operation of said operating lever, to caulk the end portions of the respective two component holding tapes and the connecting member which are held by said holding device, and
    wherein said motion converting device converts a pivot motion of said operating lever into a rotary motion of said rotary body.

3. The component-holding-tape connecting apparatus according to claim 1, wherein said rotary body has a plurality of metallic-connecting-member connecting-member holding portions in an outer circumferential surface thereof, and holds the metallic connecting members in the respective metallic-connecting-member connecting-member holding portions.

4. The component-holding-tape connecting apparatus according to claim 3, further comprising a rotary-body holding portion rotatably and detachably holding said rotary body.

5. The component-holding-tape connecting apparatus according to claim 4,
    wherein said rotary body is rotatable relative to said rotary-body holding portion about said rotary axis, wherein said rotary body is movable relative to said rotary-body holding portion in an axial direction parallel to said rotary axis, so as to be detachable from said rotary-body holding portion, wherein each of at least one of said rotary body and said rotary-body holding portion has a magnet, and wherein said rotary body is attracted by said rotary-body holding portion owing to a magnetic force of said magnet, so as to be held in a certain position relative to said rotary-body holding portion in said axial direction.

6. The component-holding-tape connecting apparatus according to claim 5, wherein said rotary body and said rotary-body holding portion have respective magnets each provided by said magnet, wherein one of the magnets includes a plurality of magnet members disposed to be spaced apart from each other by an angular pitch equal to said predetermined angle, and wherein each of said plurality of magnet members is brought into a position opposed to a magnet member of the other of said magnets, when said rotary body is positioned in an angular position which causes a corresponding one of the plurality of connecting members to be positioned in said predetermined position.

7. The component-holding-tape connecting apparatus according to claim 1, wherein said rotary body of said supplying device is operated to hold an elongated-shaped holding member which has engaged portions equally spaced apart from each other in a longitudinal direction thereof and which holds the plurality of connecting members which are equally spaced apart from each other, and wherein said rotary body has, in an outer circumferential surface, engaging portions which are equi-angularly spaced apart from each other and which are to be held in engagement with the respective engaged portions.

8. The component-holding-tape connecting apparatus according to claim 7, further comprising a cutting-off device cutting each of the connecting members off from the holding member while said each of the connecting members is being positioned in said predetermined position.

9. The component-holding-tape connecting apparatus according to claim 8, wherein said supplying device includes, in addition to said rotary body, a moving device holding the connecting member cut off by said cutting-off device and moving the connecting member to said caulking position.

10. The component-holding-tape connecting apparatus according to claim 9, wherein said moving device includes a second rotary body which is other than said rotary body as a first rotary body, and wherein said second rotary body has a plurality of connecting-member holding portions to hold the connecting members, and is rotatable about a second rotary axis thereof which is other than said rotary axis as a first rotary axis.

11. The component-holding-tape connecting apparatus according to claim 10, wherein said plurality of connecting-member holding portions of said second rotary body have respective magnets, and wherein said second rotary body holds metallic connecting members as the connecting members which are attracted by said plurality of connecting-member holding portions owing to a magnetic force of each of said magnets.

12. The component-holding-tape connecting apparatus according to claim 10, wherein said cutting-off device has cutting blades each of which is provided in a corresponding one of said plurality of connecting-member holding portions of said second rotary body.

13. The component-holding-tape connecting apparatus according to claim 10, wherein each of said plurality of connecting-member holding portions of said second rotary body constitutes a caulking tool for deforming the at least one of the plurality of caulking claws.

14. The component-holding-tape connecting apparatus according to claim 10, further comprising an operating lever and a motion converting device, wherein said caulking device is operated by operation of said operating lever, and wherein said motion converting device converts a pivot motion of said operating lever into a rotary motion of said second rotary body.

15. The component-holding-tape connecting apparatus according to claim 8, further comprising an operating lever and a guide portion, wherein said caulking device is operated by operation of said operating lever, wherein said guide portion guides the holding member toward said predetermined position in which each of the connecting members is to be cut off from the holding member, and wherein said guide portion constitutes a second operating lever which cooperates with said operating lever as a first operating lever to operate said caulking device.

16. The component-holding-tape connecting apparatus according to claim 8, further comprising an operating lever and a guide portion, wherein said caulking device is operated by operation of said operating lever, wherein said guide portion guides the holding member away from said predetermined position in which each of the connecting members is to be cut off from the holding member, and wherein said guide portion constitutes a second operating lever which cooperates with said operating lever as a first operating lever to operate said caulking device.

17. The component-holding tape connecting apparatus according to claim 1, wherein said rotary body of said supplying device positions each of the plurality of connecting members in said predetermined position as said caulking position.

18. The component-holding-tape connecting apparatus according to claim 1, wherein said supplying device includes a moving device moving each of the plurality of connecting members, which has been positioned in said predetermined position by said rotary body of said supplying device, to said caulking position.

* * * * *